United States Patent
Lee et al.

(10) Patent No.: US 11,448,970 B2
(45) Date of Patent: Sep. 20, 2022

(54) LITHOGRAPHY SYSTEM AND METHODS

(71) Applicant: Taiwan Semiconductor Manufacturing Co., Ltd., Hsinchu (TW)

(72) Inventors: Eng Hock Lee, Hsinchu (TW); Wen-Hao Cheng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 17/209,590

(22) Filed: Mar. 23, 2021

(65) Prior Publication Data

US 2022/0075273 A1 Mar. 10, 2022

Related U.S. Application Data

(60) Provisional application No. 63/075,964, filed on Sep. 9, 2020.

(51) Int. Cl.
*G03F 7/20* (2006.01)

(52) U.S. Cl.
CPC ...... *G03F 7/70316* (2013.01); *G03F 7/70033* (2013.01)

(58) Field of Classification Search
CPC ............ G03F 7/70316; G03F 7/70033; G03F 7/70958; G03F 7/70233; G02B 1/14; G02B 5/0816; G02B 1/10; G02B 5/0891; B82Y 30/00
See application file for complete search history.

(56) References Cited

U.S. PATENT DOCUMENTS

| 6,249,378 B1 * | 6/2001 | Shimamura | G02B 5/0825 |
| | | | 353/20 |
| 2016/0327702 A1 * | 11/2016 | Schicketanz | G02B 5/0875 |

* cited by examiner

*Primary Examiner* — Mesfin T Asfaw
(74) *Attorney, Agent, or Firm* — Seed IP Law Group LLP

(57) ABSTRACT

A lithography exposure system includes a light source, a substrate stage, and a mask stage between the light source and the substrate stage along an optical path from the light source to the substrate stage. The lithography exposure system further comprises a reflector along the optical path. The reflector comprises: a first layer having a first material and a first thickness; a second layer having the first material and a second thickness different from the first thickness; and a third layer between the first layer and the second layer, and having a second material different from the first material.

17 Claims, 19 Drawing Sheets

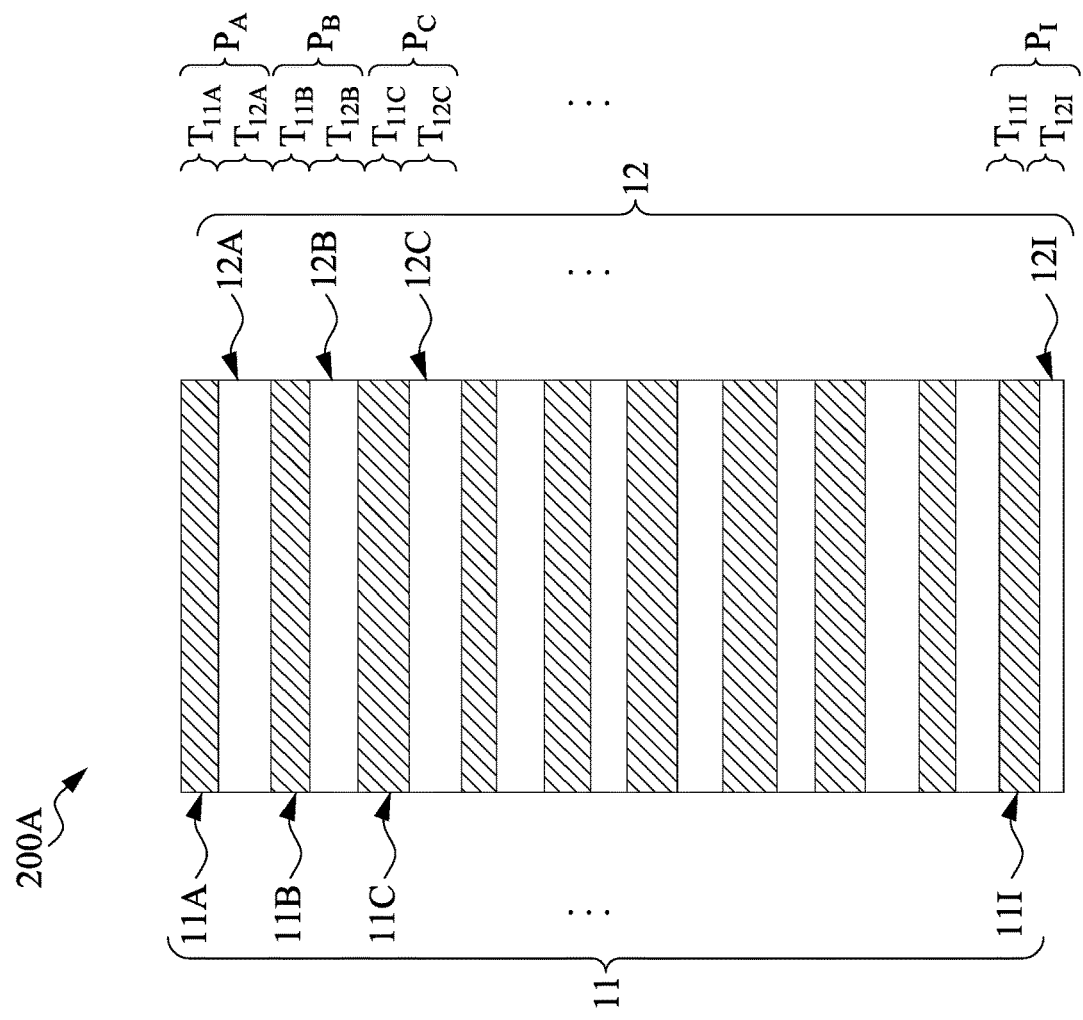
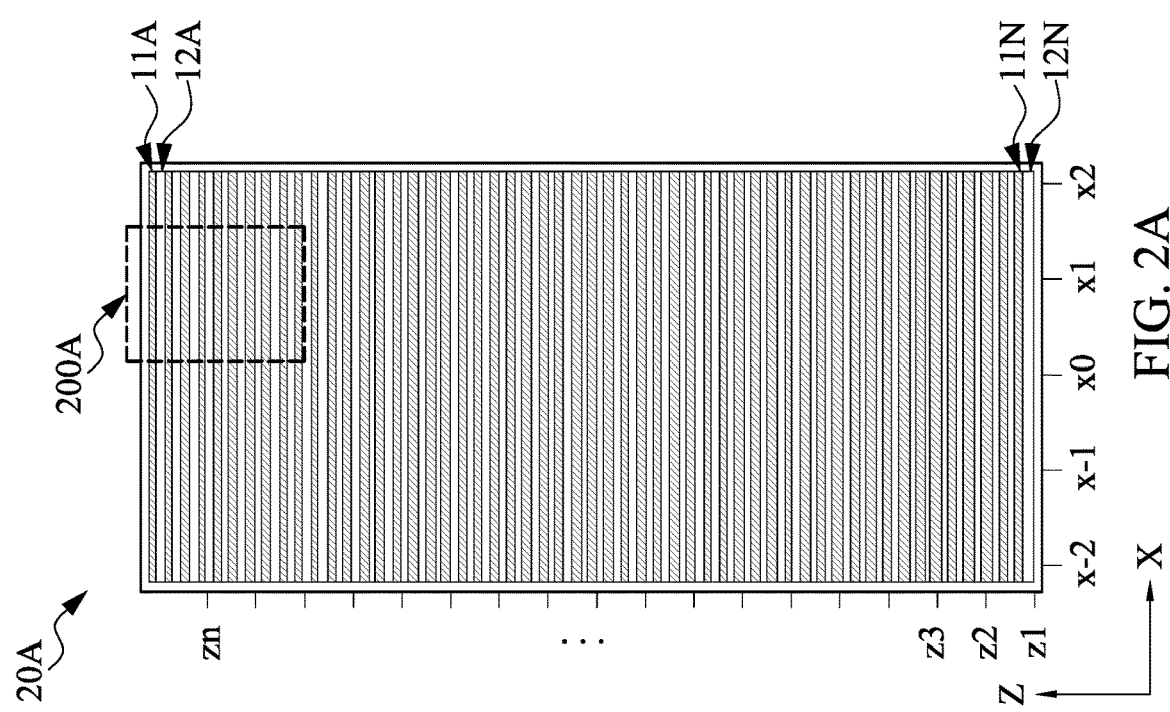
FIG. 2A
FIG. 2B

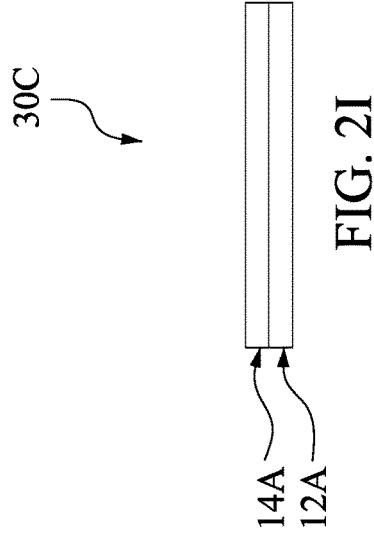
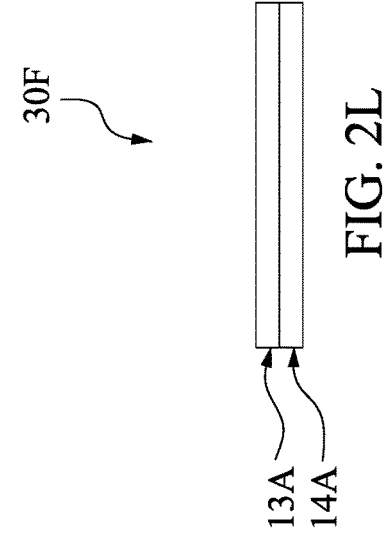
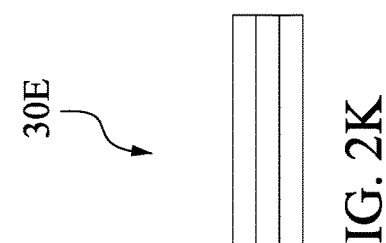
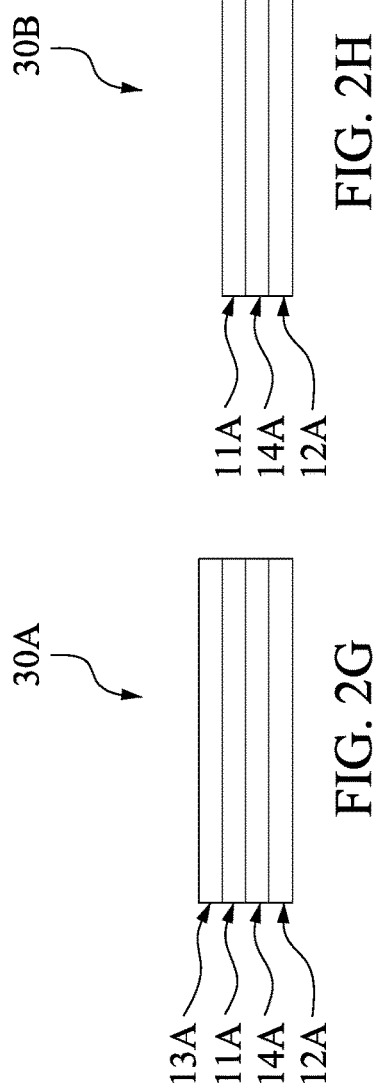
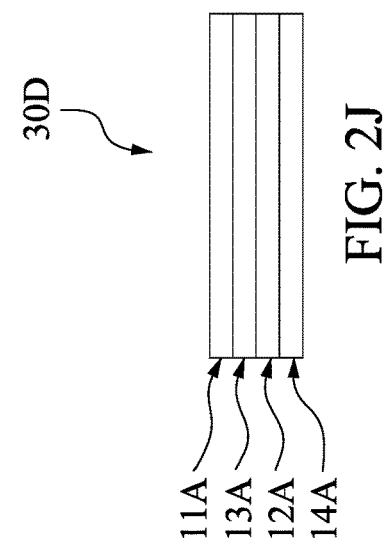

LITHOGRAPHY SYSTEM AND METHODS

PRIORITY CLAIM AND CROSS-REFERENCE

This application claims the benefit of priority to U.S. Provisional Application Ser. No. 63/075,964, entitled "PRODUCTIVITY ENHANCEMENT OF EUV LITHOGRAPHY BY INVERSE DESIGN OPTIMIZATION OF MULTILAYER MIRROR AND MASK," filed on Sep. 9, 2020, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-6B are views illustrating a method of fabricating a mirror structure according to various aspects of the present disclosure.

DETAILED DESCRIPTION

Figure 1A:
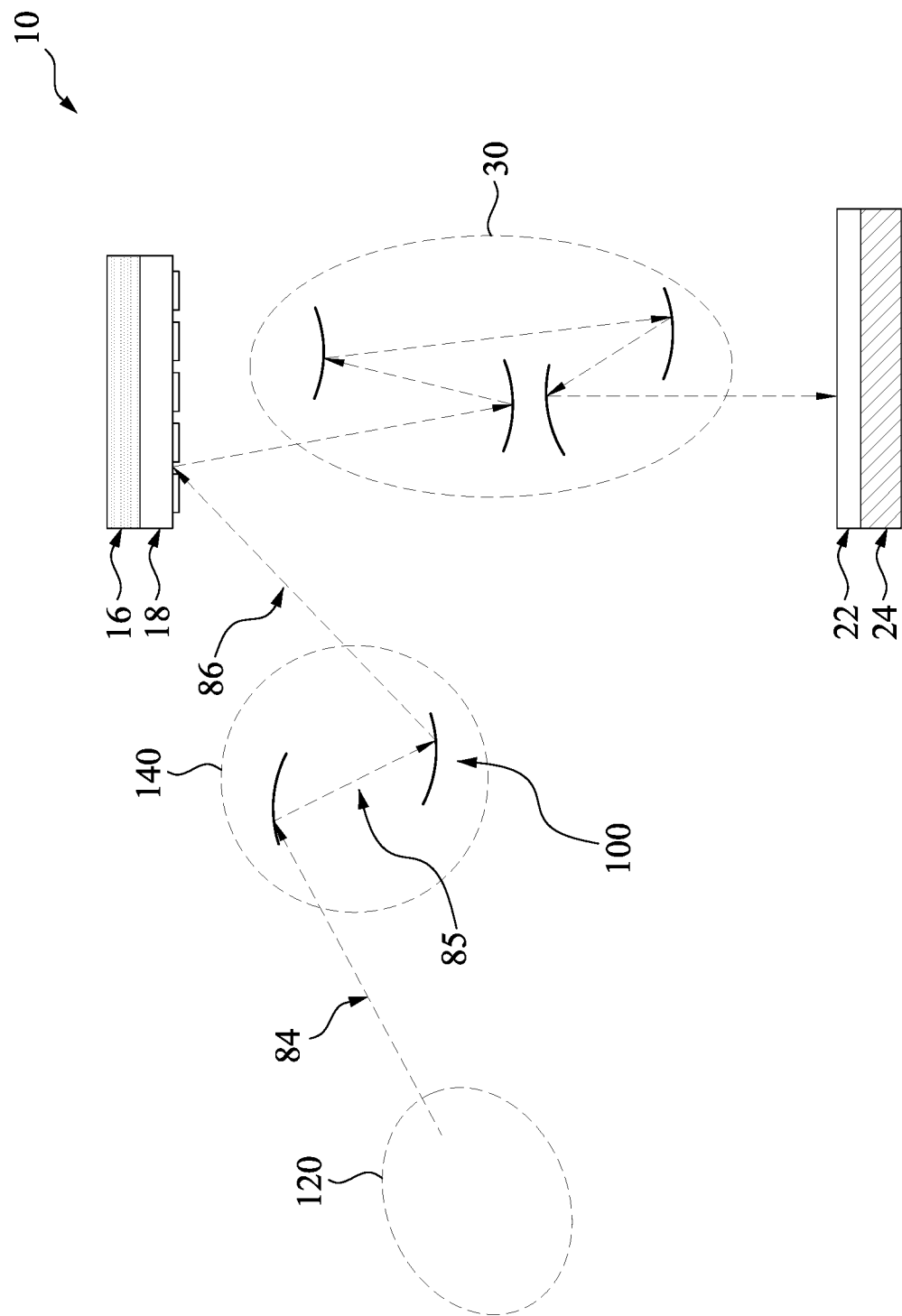
FIG. 1A-1E are views of portions of a lithography scanner according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

The present disclosure is generally related to lithography equipment for fabricating semiconductor devices, and more particularly to reflective multilayers of field facet mirrors, pupil facet mirrors, reticles/masks, projection mirrors, and the like. Dimension scaling (down) is increasingly difficult in advanced technology nodes. Lithography techniques employ ever shorter exposure wavelengths, including deep ultraviolet (DUV; about 193-248 nanometers), extreme ultraviolet (EUV; about 10-100 nanometers; particularly 13.5 nanometers), and X-ray (about 0.01-10 nanometers) to ensure accurate patterning at the scaled-down dimensions.

A typical EUV scanner, one type of lithography equipment, includes about 10 reflectors, such as the various mirrors and mask listed above. Each reflector generally has reflectivity less than about 70% (see FIG. 1B, for example), such as about 67%. As such, total reflectivity over a path including the 10 reflectors may be less than about 2% ($R^{10}=0.67^{10}\approx 1.8\%$), which translates to a loss of EUV energy of over 98%. It is observed that some portion of this EUV energy loss due to reflectivity is a result of two effects. First, only two materials are used in the multilayer mirror structure, typically molybdenum and silicon. Second, only one or two thicknesses are employed, such that alternating material layers (e.g., Si, Mo, Si, Mo) exhibit a high level of periodicity over the depth of the ML mirror structure.

In the embodiments of this disclosure, dramatically increased reflectivity in the reflective multilayer may be achieved by removing the above two limitations. The number of materials may be increased to three (adding ruthenium), four (adding ruthenium and strontium), or more than four. Using a greater number of materials allows for arbitrary ordering/placement of each layer relative to its neighboring layers. Thickness of the alternating layers may be aperiodic, such that each layer of the reflective multilayer may have an arbitrary thickness relative to other layers of the reflective multilayer. With a larger number of design levers to work with (layer material, thickness, ordering of layers), reflectivity of the reflective multilayer may be enhanced further by intelligent use of algorithms, such as stochastic "path finding" algorithms searching for local and/or global maxima of reflectivity, or various machine learning techniques based on big data and neural networks. In the figures, the reflective multilayers are illustrated as planar for simplicity. In some embodiments, some or all of the reflective multilayers may further be curved, such that curvature of the reflective multilayers may be a further consideration in increasing individual reflector reflectivity.

The present disclosure further describes a method of fabricating a semiconductor device using the reflector(s) including the ML mirror structure having enhanced reflectivity in a lithography operation. The method generally includes operations of depositing a mask layer over a substrate, patterning the mask layer using the ML mirror structure having enhanced reflectivity, and removing material of a layer under the mask layer exposed by openings in the mask layer formed during the patterning operation.

FIG. 1A is a schematic and diagrammatic view of a lithography exposure system 10, in accordance with some embodiments. In some embodiments, the lithography exposure system 10 is an extreme ultraviolet (EUV) lithography system designed to expose a resist layer by EUV radiation, and may also be referred to as the EUV system 10. The lithography exposure system 10 includes a light source 120, an illuminator 140, a mask stage 16, a projection optics module (or projection optics box (POB)) 30 and a substrate stage 24, in accordance with some embodiments. The elements of the lithography exposure system 10 can be added to or omitted, and the disclosure should not be limited by the embodiment.

The light source 120 is configured to generate light radiation having a wavelength ranging between about 1 nm and about 100 nm in certain embodiments. In one particular example, the light source 120 generates an EUV radiation with a wavelength centered at about 13.5 nm. Accordingly, the light source 120 is also referred to as an EUV radiation source. However, it should be appreciated that the light source 120 should not be limited to emitting EUV radiation. The light source 120 can be utilized to perform any high-intensity photon emission from excited target fuel.

In various embodiments, the illuminator 140 includes various refractive optic components, such as a single lens or a lens system having multiple reflectors 100, for example lenses (zone plates) or alternatively reflective optics (for EUV lithography exposure system), such as a single mirror or a mirror system having multiple mirrors in order to direct light from the light source 120 onto the mask stage 16, particularly to a mask 18 secured on the mask stage 16. In the present embodiment where the light source 120 generates light in the EUV wavelength range, reflective optics are employed. In some embodiments, the illuminator 140 includes at least three lenses.

The mask stage 16 is configured to secure the mask 18. In some embodiments, the mask stage 16 includes an electrostatic chuck (e-chuck) to secure the mask 18. This is because gas molecules absorb EUV radiation and the lithography exposure system for the EUV lithography patterning is maintained in a vacuum environment to avoid EUV intensity loss. In the present disclosure, the terms mask, photomask, and reticle are used interchangeably. In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multilayer deposited on the substrate.

The projection optics module (or projection optics box (POB)) 30 is configured for imaging the pattern of the mask 18 on to a semiconductor wafer 22 secured on the substrate stage 24 of the lithography exposure system 10. In some embodiments, the POB 30 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 30. The illuminator 140 and the POB 30 are collectively referred to as an optical module of the lithography exposure system 10. In some embodiments, the POB 30 includes at least six reflective optics.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV radiation in the present embodiment. Various components including those described above are integrated together and are operable to perform lithography processes.

The lithography exposure system 10 may further include other modules or be integrated with (or be coupled with) other modules, such as a cleaning module designed to provide hydrogen gas to the light source 120. The hydrogen gas helps reduce contamination in the light source 120.

Figure 1B:
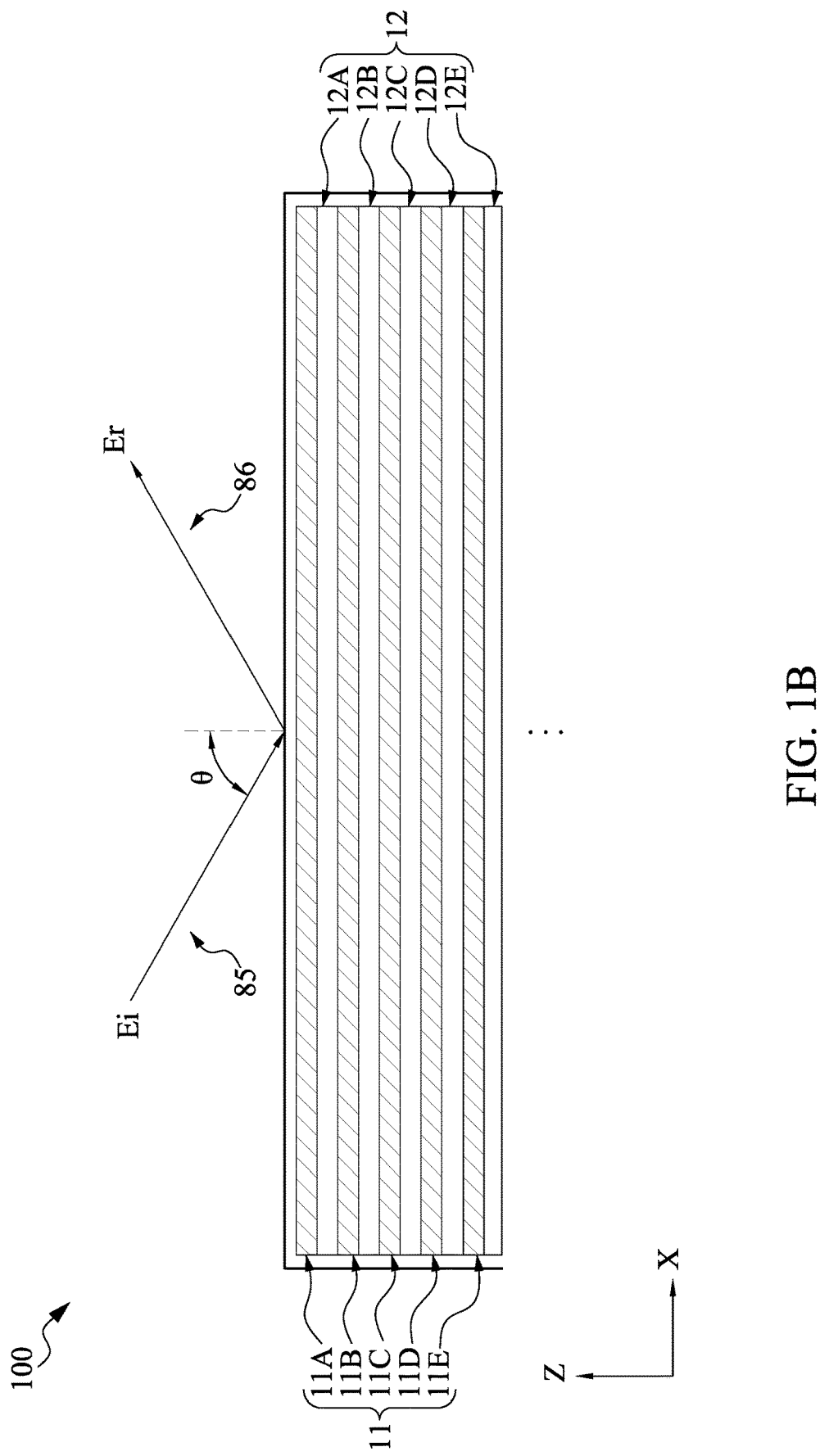

FIG. 1B is a partial view of a reflector 100, which may be included in the illuminator 140, the mask 18, and/or the POB 30. The reflector 100 is configured to reflect incident light 85 having incident energy $E_i$ incident at angle of incidence θ. Some of the incident energy $E_i$ is absorbed by the reflector 100, and reflected light 86 is reflected from an incident surface of the reflector 100 with reflected energy $E_r$. In some embodiments, reflectivity of the reflector 100 is at least 75%. In some embodiments, the reflectivity is at least 77%.

Greater reflectivity of the reflector 100 improves overall throughput of the EUV system 10. For example, for a reflectivity of 75% of each single reflector 100, for the EUV system 10 including ten reflectors 100, total reflectivity is over 5.5% ($0.75^{10}$=5.6%), a more than threefold improvement versus the reflector 100 having 67% reflectivity. For reflectivity of 77%, the EUV system 10 including ten reflectors 100 exhibits total reflectivity over 7% ($0.77^{10}$=7.3%), roughly a fourfold improvement versus the reflector 100 having 67% reflectivity.

The reflector 100 includes a reflective multilayer including first material layers 11A-11E, collectively referred to as "first material layers 11" or "reflector layers 11," and second material layers 12A-12E, collectively referred to as "second material layers 12" or "spacer layers 12." The first and second material layers 11, 12 may further be referred to collectively as "material layers 11, 12." While five of each of the first and second material layers 11, 12 are shown in FIG. 1B, the reflector 100 may include many more first and second material layers 11, 12, such as about 50 of each, though lesser or greater numbers may be present in various embodiments. In some embodiments, the first material layers 11 are or comprise molybdenum and the second material layers 12 are or comprise silicon. The reflective multilayer includes a plurality of film pairs, such as molybdenum-silicon (Mo/Si) film pairs (e.g., a layer 11B of molybdenum above or below a layer 12B or 12A of silicon in each film pair). Alternatively, the reflective multilayer may include molybdenum-beryllium (Mo/Be) film pairs, or other suitable materials that are configurable to reflect the EUV radiation. The reflector 100 may further include a capping layer (not specifically illustrated for simplicity), such as ruthenium (Ru), disposed on the reflective multilayer for protection. When the reflector 100 is the mask 18, the reflector 100 may further include an absorption layer, such as a tantalum boron nitride (TaBN) layer, deposited over the reflective multilayer. The absorption layer is patterned to correspond to a layer of an integrated circuit (IC). Alternatively, another reflective layer may be deposited over the reflective multilayer and is patterned to correspond to a layer of an integrated circuit, thereby forming an EUV phase shift mask.

Figure 1C:
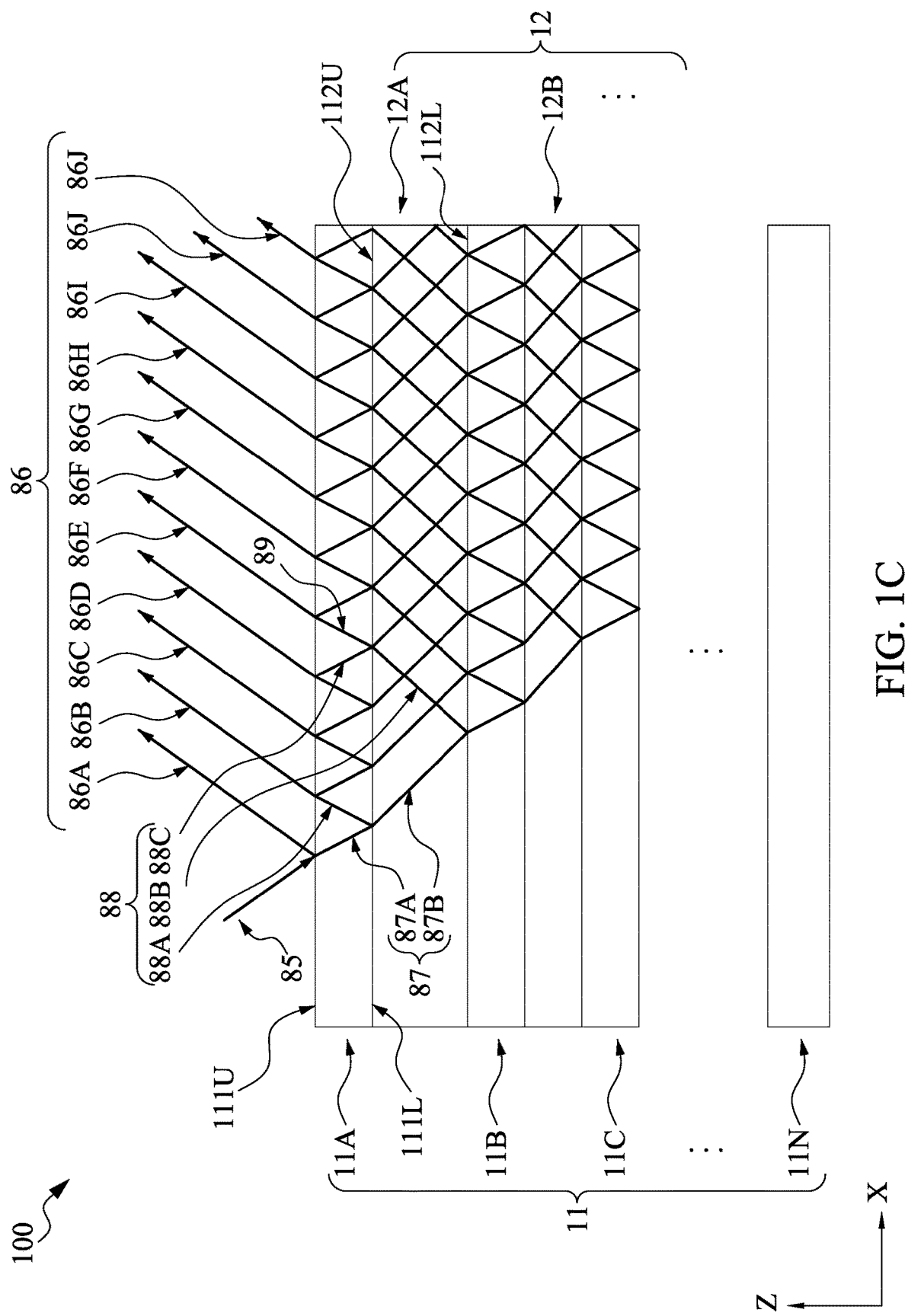

FIG. 1C is a detailed view of reflection of light in the reflector 100 in accordance with various embodiments. In FIG. 1B, a single arrow represents the incident light 85, and a second single arrow represents the reflected light 86 for simplicity of illustration. For the reflective multilayer having as many as one hundred total layers, reflection of light is a complicated process including reflection and transmission at each material interface, as depicted in FIG. 1C. For example, the incident light 85 is partially reflected at an upper surface 111U of the first material layer 11A, which is the uppermost first material layer nearest a light source (e.g., a reflector 100 or light source 120), to form a first reflected light 86A of the reflected light 86. Transmitted light 87A of the incident light 85 transverses the first material layer 11A before reaching a lower surface 111L of the first material layer 11A, which substantially interfaces with an upper surface 112U of the second material layer 12A immediately underlying the first material layer 11A.

At the interface between the first material layer 11A and the second material layer 12A, the transmitted light 87A is further reflected and transmitted to form internally reflected light 88A and transmitted light 87B, respectively. FIG. 1C further illustrates internally reflected light 88B, 88C. The internally reflected light 88A-88C may collectively be referred to as internally reflected light 88. Internally reflected light 88B is reflected by the first material layer 11B from transmitted light 87B incident on the interface between the second material layer 12A and the first material layer 11B. In some embodiments, composite light 89 is formed, which includes internally reflected light from the internally reflected light 88C, as well as transmitted light from the internally reflected light 88B.

Transmitted light 86E is light that escapes the reflector 100 when the composite light 89 is incident on the interface between the reflective multilayer and either the capping layer or the external atmosphere, e.g., vacuum. Generally the reflected light 86, which includes reflected light 86A-86J, includes some combination of reflected light (e.g., first reflected light 86A), transmitted light (e.g., transmitted light 86B, 86C), and composite light (e.g., composite light 86D-86J).

Based on the above, a rigorous calculation of all transmissions and reflections throughout the reflective multilayer may be performed to calculate the reflectivity of the reflective multilayer. The calculation may be based on a number of parameters, including, but not limited to, incident light wavelength, incident light intensity, angle of incidence, material properties of each layer (e.g., extinction coefficient and/or refraction coefficient of each first and second multilayer 11, 12), thickness of each layer, and ordering of the layers.

Figure 1D:
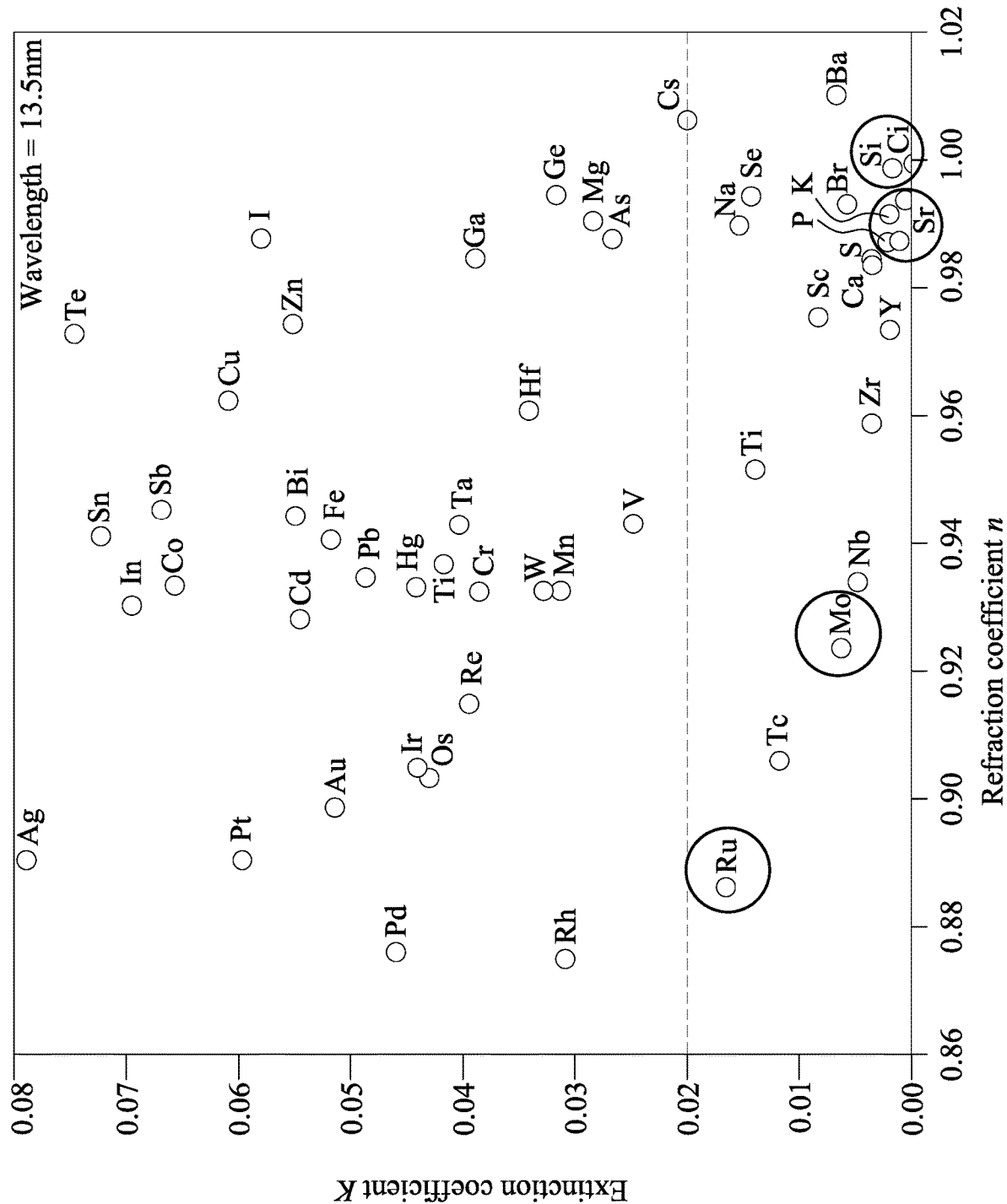

FIG. 1D is a graph illustrating the material properties of various materials on axes of refraction coefficient n (horizontal axis) and extinction coefficient K (vertical axis). In some embodiments, based on material of each layer, reflectivity at an interface of two materials may be approximated as a difference in refraction coefficient. For example, for an interface of a first material having refraction coefficient n1 and a second material having refraction coefficient n2, reflectivity at the interface may be approximated as |n1-n2|. Generally, to maximize reflectivity at each interface in the reflective multilayer, it is observed that difference between refraction coefficients n1, n2 of neighboring layers should be high, and all materials should have a low extinction coefficient K.

As such, in some embodiments, it may be desirable to select materials having extinction coefficient K<0.02, as illustrated by the horizontal hashed line in FIG. 1D. Generally, materials having extinction coefficient K greater than 0.02 do not provide a significant benefit to overall reflectivity of the reflective multilayer. Materials below the horizontal hashed line have extinction coefficient K<0.02, and include Ru, Tc, Mo, Nb, Ti, Zr, Y, Sc, and the like. Further, to achieve good reflection at the interfaces between each pair of two neighboring layers, it is preferable that the materials of the neighboring layers exhibit significant separation therebetween along the horizontal axis. In some embodiments, the reflective multilayer includes layers of ruthenium, molybdenum, strontium, and/or silicon, as illustrated in FIG. 1D by circles around the respective points on the graph corresponding thereto. In some embodiments, the reflective multilayer may further include layers of niobium, or another suitable material.

Based on calculation of the reflectivity of the reflective multilayer, high reflectivity may be achieved by a stochastic inverse design methodology which searches for increasingly high reflectivity through combining material layers having arbitrary, aperiodic ordering of materials and thicknesses. The thicknesses may be lower bounded based on constraints for practical manufacturing of thin films of each material type. As such, the lower bound for ruthenium may be different from the lower bound for molybdenum, which may be different from the lower bounds for strontium and silicon. Various stochastic inverse design processes are illustrated in FIGS. 4-6B.

Figure 1E:
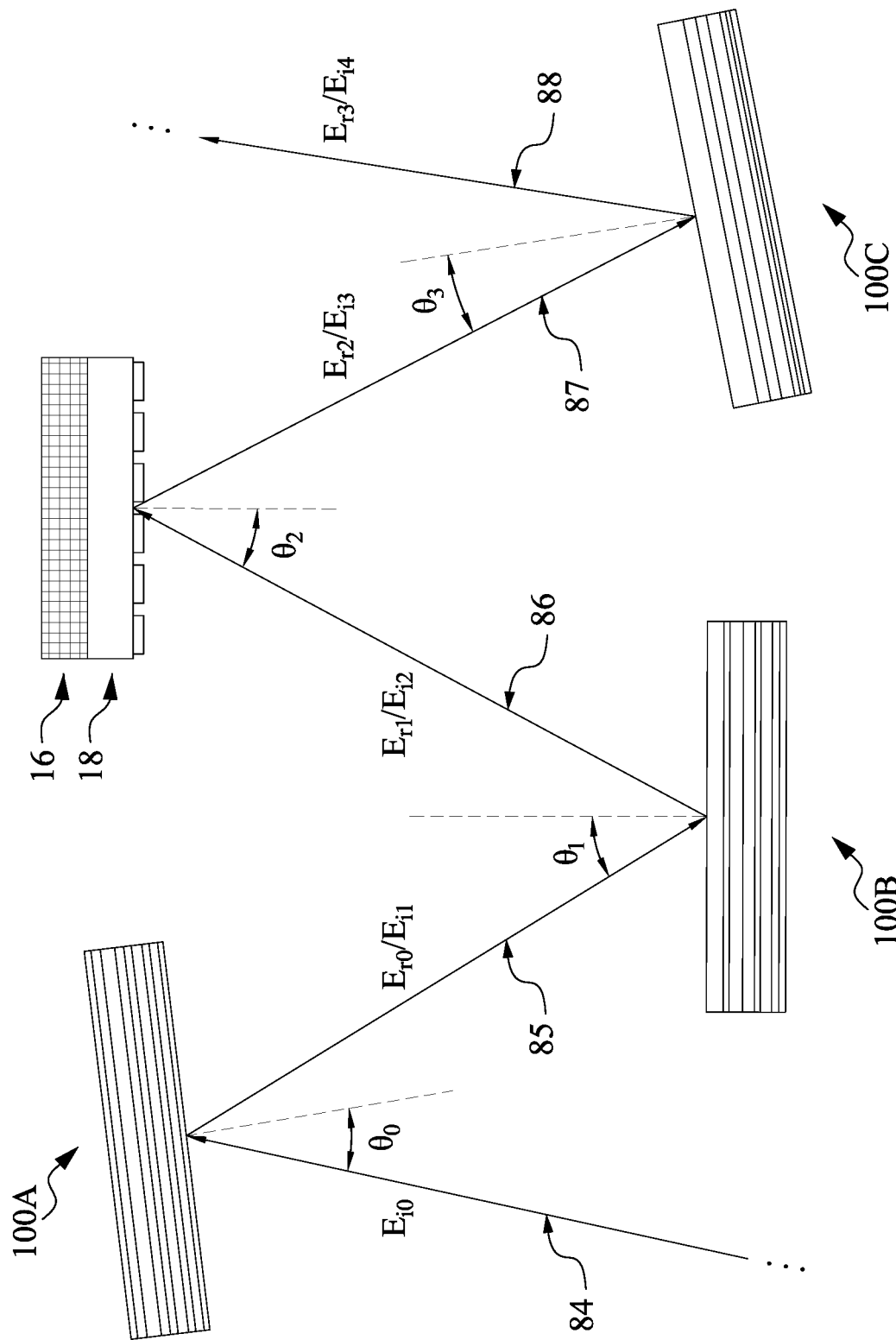

FIG. 1E illustrates a partial optical path of the lithography exposure system 10 of FIG. 1A, including the mask stage 16, two reflectors 100A, 100B preceding the mask stage 16, and one reflector 100C following the mask stage 16. The reflectors 100A, 100B may be part of the illuminator 140, and the reflector 100C may be part of the projection optics module 30.

The partial optical path of FIG. 1E illustrates change of incident light 84 into reflected light 88 following reflection by the reflectors 100A, 100B, the mask stage 16, and the reflector 100C. More specifically, the incident light 84 having incident energy $E_{i0}$ is incident on the reflector 100A at angle of incidence $\theta_0$ (measured against the normal of the reflector 100A, illustrated by a hashed line perpendicular to the major surface of the reflector 100A in FIG. 1E). The incident light 84 is partially reflected and partially attenuated by the reflector 100A. The reflected light 85 having energy $E_{r0}$ is the portion of the incident light 84 reflected by the reflector 100A. Relative to the reflector 100B, the reflected light 85 is also incident light 85 having incident energy $E_{i0}$ equal to the energy $E_{r0}$. The incident light 85 is incident upon the reflector 100B at angle of incidence $\theta_1$. The incident light 85 is reflected to form the reflected/incident light 86, which has energy $E_{r1}/E_{i2}$. The incident light 86 is incident on the mask stage 16 at an angle of incidence $\theta_2$, and is reflected to form reflected/incident light 87 having energy $E_{r2}/E_{i3}$. The incident light 87 is incident on the reflector 100C at angle of incidence $\theta_3$, and is reflected to form reflected/incident light 88 having energy $E_{r3}/E_{i4}$.

Though the reflective multilayer of each of the reflectors 100A-100C and the mask stage 16 may be the same, as illustrated in FIG. 1E, but not specifically labeled, generally the reflective multilayer of each of the reflectors 100A-100C and the mask stage 16 may have different design. For example, the reflector 100B may have more, fewer or the same number of layers 11-14 (first, second, third, and/or fourth layers 11-14; FIGS. 2A-2F) than the reflector 100A, and more, fewer, or the same number of layers 11-14 than the reflector 100C. In some embodiments, the reflector 100B has more, fewer, or the same number of types of layers as the reflector 100A, and more, fewer, or the same number of types of layers as the reflector 100C. In some embodiments, some of the reflectors 100A-100C and the mask stage 16 have the same reflective multilayer design, while others have different design. As such, each of the reflectors 100A-100C and the mask stage 16 may be designed individually to achieve high reflectivity based on relative position and/or angle of incidence $\theta_0$-$\theta_3$ with respect to the immediately preceding and/or immediately following reflector or mask stage. In some embodiments, some of the reflectors 100A-100C or the mask stage 16 include a reflective multilayer that is aperiodic and non-alternating. In some embodiments, some of the reflectors 100A-100C or the mask stage 16 include a reflective multilayer that is aperiodic and alternating. In some embodiments, some of the reflectors 100A-100C or the mask stage 16 include a reflective multilayer that is periodic and alternating.

From a systems perspective, individual reflectors 100A-100C and/or mask stage 16 may be designed for high reflectivity, and the overall optical path may also be designed for high reflectivity, taking into account distance between reflectors, angles of incidence, curvature of reflectors, and the like.

Figure 2D:
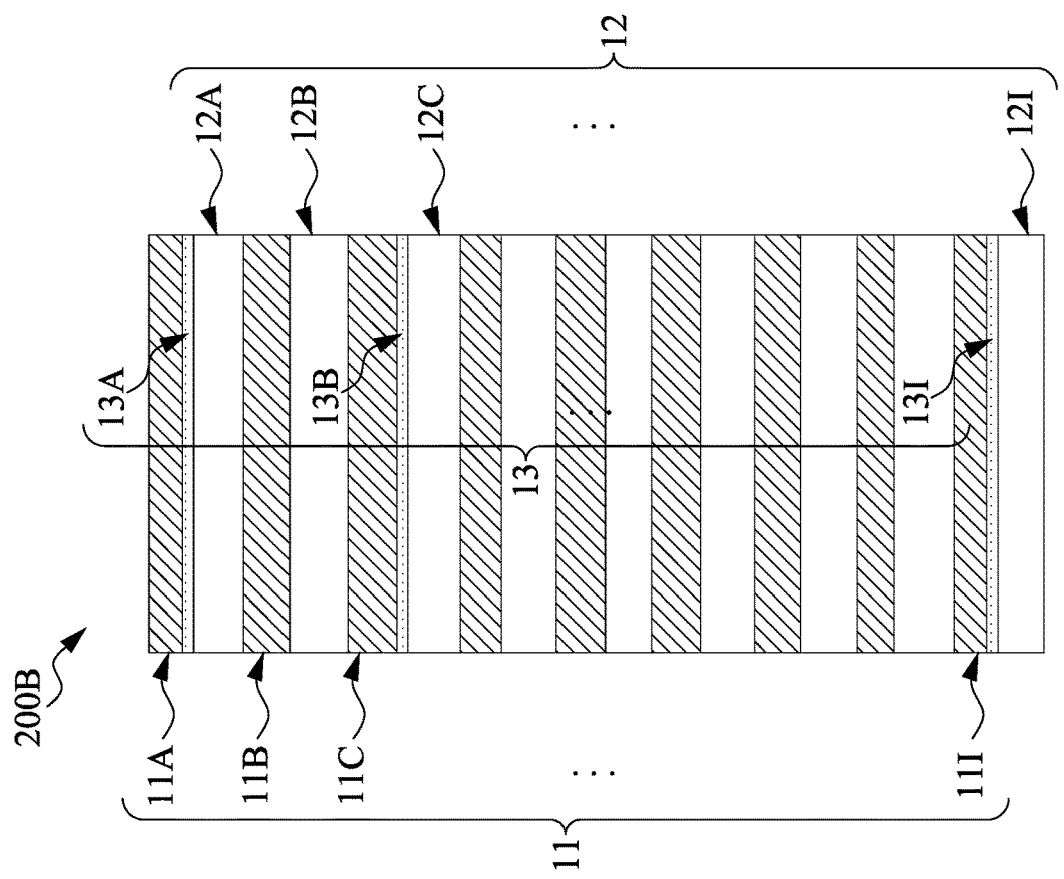
FIGS. 2A-3D are views of various embodiments of a mirror structure of a lithography scanner according to various aspects of the present disclosure.
Figure 2C:
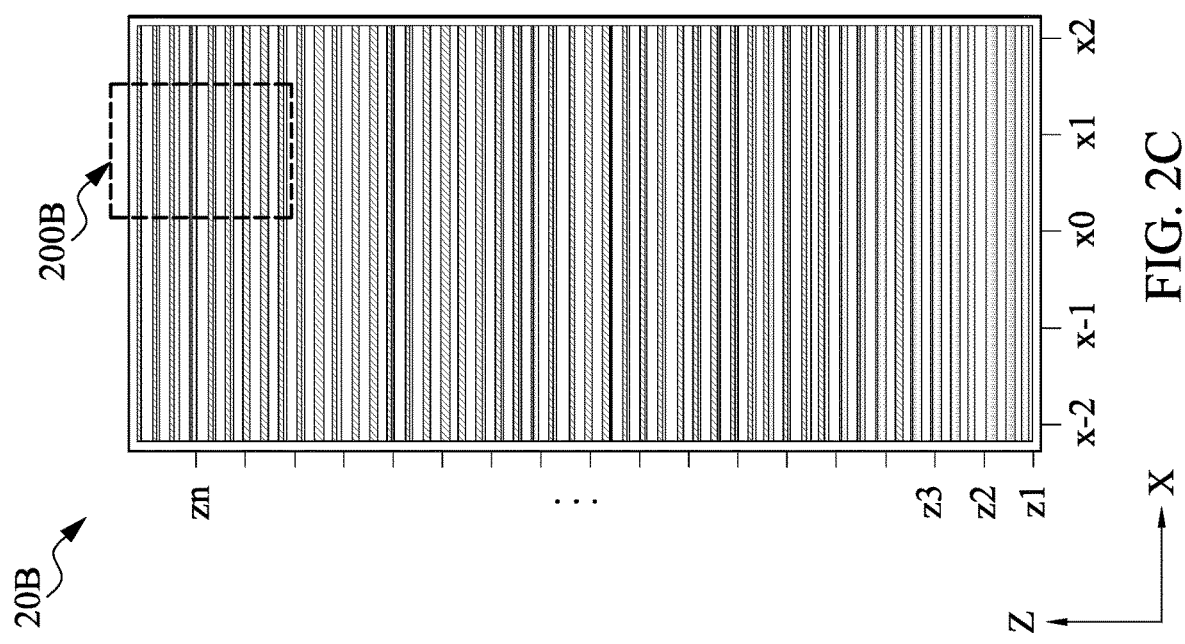
Figure 2F:
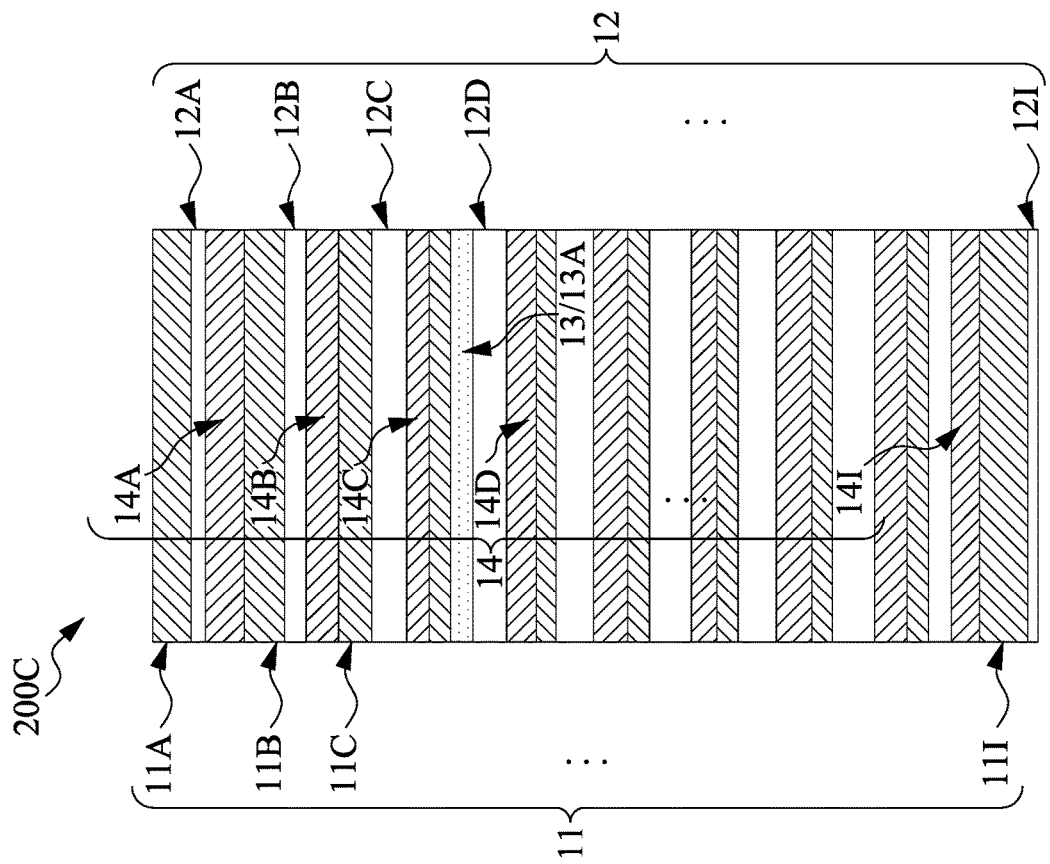
Figure 2E:
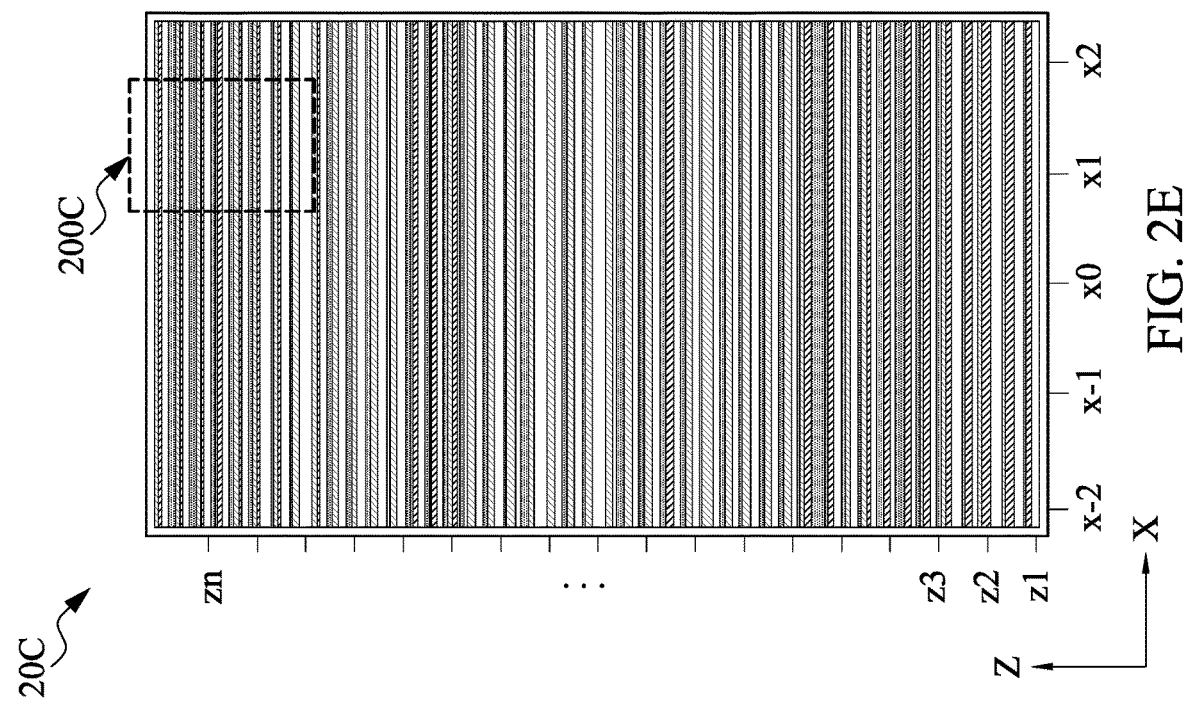

FIGS. 2A, 2C, and 2E are partial cross-sectional views of reflective multilayers 20A, 20B, 20C in accordance with various embodiments. FIGS. 2B, 2D, and 2F are enlarged views of regions 200A, 200B, 200C of the reflective multilayers 20A, 20B, 20C, respectively. As described above, design of reflective multilayers 20A, 20B, 20C may be dependent on many factors. As such, the views of FIGS. 2A-2F, while illustrative of various features related to specific embodiments, should not be understood as limiting to any one specific design or configuration.

In FIG. 2A, reflective multilayer 20A is shown, which includes two types of material layers 11, 12. In some embodiments, the first material layers 11 are layers of molybdenum and the second material layers 12 are layers of silicon. Thickness of each material layer 11, 12, measured along the Z direction, may be substantially constant along the horizontal plane, such as along the X direction as shown in FIG. 2A and further in a Y direction (not specifically labeled) orthogonal to both the X and Z directions. Each material layer 11A-11I may have arbitrary thickness within process limitations, and each material layer 12A-12I may have arbitrary thickness within process limitations. In some embodiments, thicknesses $T_{11A}$-$T_{12I}$ of the first and second material layers 11, 12 are each at least about 5 Angstroms, and the material layers 11, 12 are deposited by an ALD process. In some embodiments, thicknesses $T_{11A}$-$T_{12I}$ lower than 5 Angstroms exhibit voids or other non-uniformity that degrades yield. In some embodiments, the first material layers 11 have thickness in a range of about 20 Angstroms to about 40 Angstroms. In some embodiments, the second material layers 12 have thickness in a range of about 30 Angstroms to about 45 Angstroms. Further description of thicknesses and variations over the reflective multilayer 20A is provided with reference to FIG. 3A.

As shown in FIG. 2A and FIG. 2B, in configurations of the reflective multilayer 20A only including two types of material layers 11, 12, the material layers 11, 12 alternate along the Z direction. As such, material layer 12C underlies material layer 11C, which underlies material layer 12B, which underlies material layer 11B, and so on. Other than top and bottom layers of the reflective multilayer 20A, each intermediate first material layer 11 directly contacts a second material layer 12 thereabove and a second material layer 12 therebelow. For example, the first material layer 11B is in direct contact with the second material layer 12A and the second material layer 12B. Likewise, the second material layer 12B is in direct contact with the first material layer 11B and the first material layer 11C. As such, the reflective multilayer 20A may be said to be alternating and periodic with respect to materials.

In FIG. 2B, due to the inclusion of only two types of material layers 11, 12, the reflective multilayer 20A can be said to include a plurality of bilayers having arbitrary periods $P_A$, $P_B$, $P_C$, . . . , $P_I$. Each period, for example the period $P_B$, is the sum of thicknesses of two layers, such as the thickness $T_{11B}$ of the first material layer 11B and the thickness $T_{12B}$ of the second material layer 12B. Because the thicknesses $T_{11A}$-$T_{12I}$ are arbitrary, the periods $P_A$, $P_B$, $P_C$, . . . , $P_I$ are arbitrary, and the period of each bilayer may be greater than, less than, or the same as overlying or underlying (neighboring) bilayers. For example, as shown in FIG. 2B, the period $P_B$ corresponding to the bilayer including the first material layer 11B and the second material layer 12B is less than the period $P_C$ corresponding to the bilayer including the first material layer 11C and the second material layer 12C. In some embodiments, the period $P_A$ and the period $P_C$ are the same, but the first material layers 11A, 11C have different thicknesses, and the second material layers 12A, 12C have different thicknesses. The reflective multilayer 20A may be said to be non-alternating with respect to thicknesses. Generally, the reflective multilayer 20A has at least one bilayer having different period than some or all of the remaining bilayers of the reflective multilayer 20A. As such, the reflective multilayer 20A may also be said to be aperiodic with respect to thicknesses. In some embodiments, a degree of bilayer aperiodicity may be calculated as deviation of period of each bilayer around a mean. More detailed description of degree of bilayer aperiodicity is provided with respect to FIG. 3D.

In FIG. 2C and FIG. 2D, the reflective multilayer 20B is illustrated in cross-sectional view and the region 200B is shown in enlarged view, respectively. The reflective multilayer 20B includes three different materials in material layers 11, 12, 13. The first material layers 11 and the second material layers 12 are described in detail above with reference to FIGS. 2A and 2B. In some embodiments, the third material layers 13 are layers of ruthenium. Thickness of the third material layers 13, measured along the Z direction, may be substantially constant along the horizontal plane, such as along the X direction as shown in FIG. 2C and further in a Y direction (not specifically labeled) orthogonal to both the X and Z directions. Each material layer 13A-13I may have arbitrary thickness within process limitations. In some embodiments, thicknesses $T_{13A}$-$T_{13I}$ (not specifically labeled) of the third material layers 13 are each at least about 5 Angstroms, and the third material layers 13 are deposited by an ALD process. In some embodiments, thicknesses $T_{13A}$-$T_{13I}$ lower than 5 Angstroms exhibit voids or other non-uniformity that degrades yield. In some embodiments, in the reflective multilayer 20B, the first material layers 11 have thickness in a range of about 5 Angstroms to about 35 Angstroms. In some embodiments, the second material layers 12 have thickness in a range of about 25 Angstroms to about 50 Angstroms. In some embodiments, the third material layers 13 have thickness in a range of about 5 Angstroms to about 50 Angstroms. Further description of thicknesses and variations over the reflective multilayer 20B is provided with reference to FIG. 3B.

Further to FIG. 2D, as illustrated by the region 200B, the reflective multilayer 20B may be understood to be aperiodic and non-alternating with respect to thicknesses and materials. As shown, the third material layer 13A is in contact with the first material layer 11A, and in contact with the second material layer 12A. In some embodiments, the third material layer 13A is said to be intermediate between the first material layer 11A and the second material layer 12A. Turning to the first material layer 11B and the second material layer 12B, no third material layer is intermediate between the first material layer 11B and the second material layer 12B. The first material layer 11B contacts the second material layer 12A and the second material layer 12B. As such, the reflective multilayer 20B is non-alternating with respect to materials. Likewise, the reflective multilayer 20B is aperiodic with respect to materials.

Referring to the graph of FIG. 1D, molybdenum and ruthenium are relatively close to each other, being on the lower left hand side of the graph. As such, referring again to FIG. 2D, between each two second material layers 12 (e.g., silicon), at least one layer of the first material layers 11 (e.g., molybdenum) or the third material layers 13 (e.g., ruthenium) may be intermediate. For example, the single first material layer 11B is intermediate between the second material layers 12A, 12B. The first material layer 11C and the third material layer 13B are between the second material layers 12B, 12C. In some embodiments, though not specifically illustrated in FIG. 2D, a single third material layer 13 may be intermediate between two neighboring second material layers 12, such that the third material layer 13 contacts a second material layer 12 above and a second material layer 12 beneath. As such, the reflective multilayer 20B of FIG. 2D may be considered a stack of bilayers, each including a second material layer 12 (or "spacer layer 12") and at least one first or third material layer 11, 13 (or "reflector layer 11, 13"). Due to variation in materials of the reflector layer 11 and/or 13 of each bilayer, the reflective multilayer 20B is aperiodic with respect to materials.

In FIG. 2E and FIG. 2F, the reflective multilayer 20C is illustrated in cross-sectional view and the region 200C is shown in enlarged view, respectively. The reflective multilayer 20C includes four different materials in material layers 11, 12, 13, 14. The first, second and third material layers 11, 12, 13 are described in detail above with reference to FIGS. 2A-2D. In some embodiments, the fourth material layers 14, also referred to as "spacer layers 14," are layers of strontium. Thickness of the fourth material layers 14, measured along the Z direction, may be substantially constant along the horizontal plane, such as along the X direction as shown in FIG. 2E and further in a Y direction (not specifically labeled) orthogonal to both the X and Z directions. Each material layer 14A-14I may have arbitrary thickness within process limitations. In some embodiments, thicknesses $T_{14A}$-$T_{14I}$ (not specifically labeled) of the fourth material layers 14 are each at least about 5 Angstroms, and the fourth material layers 14 are deposited by an ALD process. In some embodiments, thicknesses $T_{14A}$-$T_{14I}$ lower than 5 Angstroms exhibit voids or other non-uniformity that degrades yield. In some embodiments, in the reflective multilayer 20C, the first material layers 11 have thickness in a range of about 5 Angstroms to about 35 Angstroms. In some embodiments, the second material layers 12 have thickness in a range of about 15 Angstroms to about 50 Angstroms. In some embodiments, the third material layers 13 have thickness in a range of about 5 Angstroms to about 50 Angstroms. In some embodiments, the fourth material layers 14 have thickness in a range of about 5 Angstroms to about 40 Angstroms. Further description of thicknesses and variations over the reflective multilayer 20C is provided with reference to FIG. 3C.

Referring to the graph of FIG. 1D, silicon and strontium are relatively close to each other, being on the lower right hand side of the graph. As such, referring again to FIG. 2F, the reflective multilayer 20C may be considered a stack of bilayers, each including at least one second or fourth material layer 12, 14 (or "spacer layer 12, 14") and at least one first or third material layer 11, 13 (or "reflector layer 11, 13"). Examples of bilayers 30A-30F in accordance with various embodiments are shown in FIGS. 2G-2L. Referring again to FIG. 2F, at least one layer of the first material layers 11 (e.g., molybdenum) or the third material layers 13 (e.g., ruthenium) may be intermediate between at least two spacer layers 12, 14 (e.g., silicon, strontium). For example, the single third material layer 13A is intermediate between the spacer layers 12C, 14C and the spacer layers 12D, 14D. Due to variation in materials of the reflector layer 11 and/or 13 of each bilayer, and the spacer layer 12 and/or 14, the reflective multilayer 20C is aperiodic with respect to materials.

FIGS. 3A-3D are diagrams illustrating design of the reflective multilayers 20A-20C, respectively, particularly graphs 300A-300C showing relative thicknesses and ordering of first, second, third, and/or fourth material layers 11-14 in the reflective multilayers 20A-20C, respectively. In some embodiments, the first material layers 11 are molybdenum, the second material layers 12 are silicon, the third material layers 13 are ruthenium, and the fourth material layers 14 are strontium. As described previously, ordering and thickness of the material layers 11-14 are arbitrary, and may depend on a variety of factors including wavelength of incident light, angle of incidence of the incident light, distance from previous reflector, distance to next reflector, among other appropriate factors. As such, each of the configurations illustrated in FIGS. 3A-3D represents a single solution that may be globally or locally optimal for high reflectivity based on the factors unique to the reflective multilayer 20A-20C, but which may not be globally or locally optimal if even one of the factors were altered significantly, e.g., by more than about 1% in any direction.

Generally, the reflective multilayers 20A-20C may include at least one region, e.g., from a first depth to a second depth along the Z-axis (see, for example, FIG. 2E). In each region, each of the material layers 11-14 may exhibit one or more of a number of trends. For example, in a single region encompassing about 10 layers each of at least two of the material layers 11-14, the trends may include at least a magnitude slope trend and a variation trend. In some embodiments, the magnitude slope trend may be upward, downward, or sideways, where average thickness of any one of the material layers 11-14 may generally increase (e.g., slope>0.1 Angstroms/layer), decrease (e.g., slope<−0.1 Angstroms/layer), or stay roughly the same (e.g., −0.1 Angstroms/layer<slope<0.1 Angstroms/layer), over the region. In some embodiments, the variation trend may be large or small, such that variation of the thicknesses around the average thickness in the region is high or low, respectively.

Figure 3A:
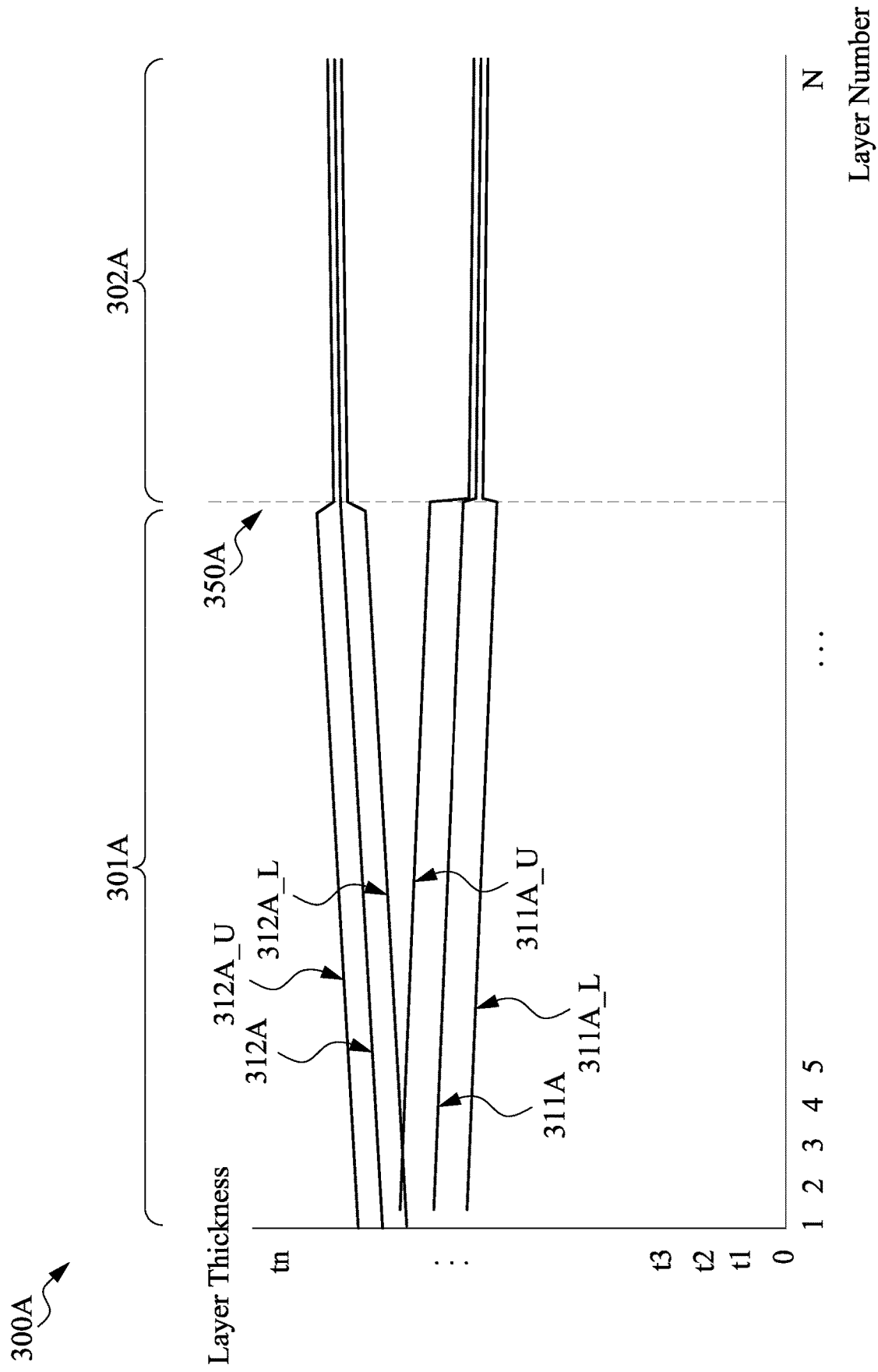

In FIG. 3A, a first line 311A illustrates average thickness of the first material layers 11 in order from first material layer 11A to first material layer 11N (see FIG. 2A), which may be a first material layer 11 most distal the incident light on the reflective multilayer 20A. A second line 312A illustrates average thickness of the second material layers 12 in order from second material layer 12A to second material layer 12N (see FIG. 2A), which may be a second material layer 12 most distal the incident light on the reflective multilayer 20A. Upper band lines 311A_U, 312A_U illustrate upper thickness deviations from the average thicknesses illustrated by the first and second lines 311A, 312A, respectively. In some embodiments, the upper thickness deviations are a maximum deviation, a first deviation, or another deviation therebetween. Lower band lines 311A_L, 312A_L illustrate lower thickness deviations from the average thicknesses illustrated by the first and second lines 311A, 312A, respectively. In some embodiments, the lower thickness deviations are a maximum deviation, a first deviation, or another deviation therebetween.

In some embodiments, the first material layers 11 alternate with the second material layers 12, and each of the first and second material layers 11, 12 has arbitrary thickness. In some embodiments, the first material layers 11 are substantially all thinner than the second material layers 12. For example, more than 90% of the second material layers 12 may be thicker than the thickest first material layer 11. In some embodiments, more than 90% of the second material layers 12 are thicker than an average thickness of the first material layers 11. In some embodiments, having the spacer layers 12 be generally thicker than the reflector layers 11 provides better overall reflectivity of the reflector 100 including the reflective multilayer 20A.

As further illustrated in FIG. 3A, the reflective multilayer 20A comprising only first material layers 11 and second material layers 12 may include at least two different regions 301A, 302A. In the embodiment shown in FIG. 3A, a first region 301A of the reflective multilayer 20A may include first and second material layers 11, 12 to the left of dividing line 350A. A second region 302A may include material layers 11, 12 to the right of the dividing line 350A. In the first region 301A, which is left of the dividing line 350A, the magnitude slope of the material layers 11 may be slightly downward, and thicknesses of the material layers 11 may have substantial variation. The magnitude slope of the material layers 12 may be slightly upward, and thicknesses of the material layers 12 may have substantial variation. In the second region 302A, the magnitude slopes of the material layers 11, 12 may be substantially sideways (slightly downward or slightly upward), and the variation trend of the thicknesses of the material layers 11, 12 may be low.

In some embodiments, the variation (or "coefficient of variation (CV)") may be quantified as standard deviation divided by average. By way of example for the purposes of illustration, average thickness of first material layers 11 in the first region 301A may be about 31 nm, and standard deviation of thicknesses of the first material layers 11 in the first region 301A may be about 2.3 nm, such that variation of the first material layers 11 in the first region 301A is about 7.4%. In the second region 302A, the average thickness of first material layers 11 may be about 27 nm, and the standard deviation may be about 0.2 nm, such that variation of the first material layers 11 in the second region 302A is about 0.74%, or about one tenth the variation in the first region 301A. For the second material layers 12, those in the first region 301A may have variation of about 4.8%, and those in the second region 302A may have variation of about 1.7%, or about one third the variation in the first region 301A. In some embodiments, variation of thickness for the material layers 11, 12 in the first region 301A is in a range of about 2% to about 20%, and variation of thickness for the material layers 11, 12 in the second region 302A is in a range of about minimum process variation (e.g., 0.01%) to about 10%. Variation of thickness for the material layers 11, 12 less than about 2% may lead to insufficient increase in reflectivity.

Figure 3B:
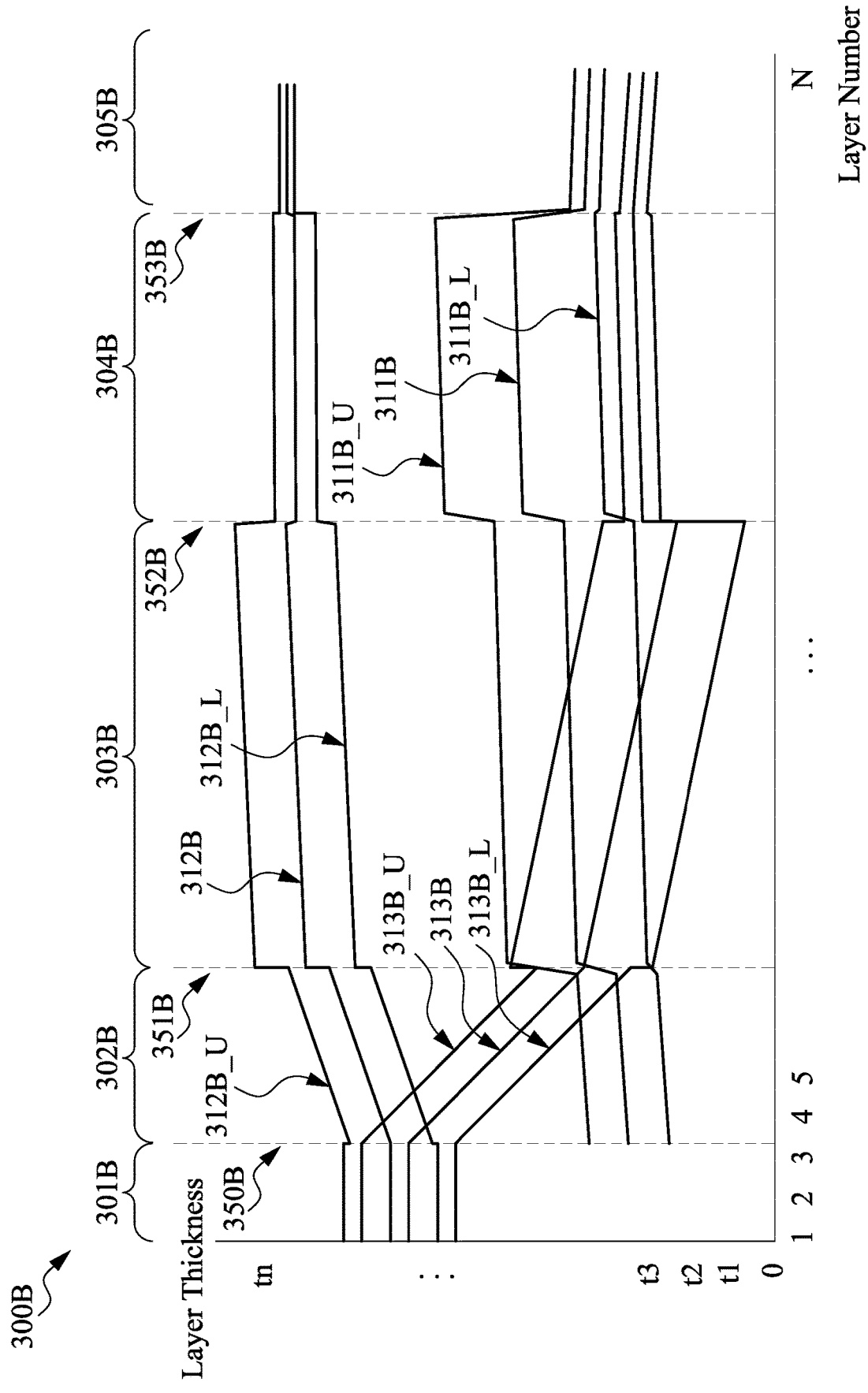
Figure 3C:
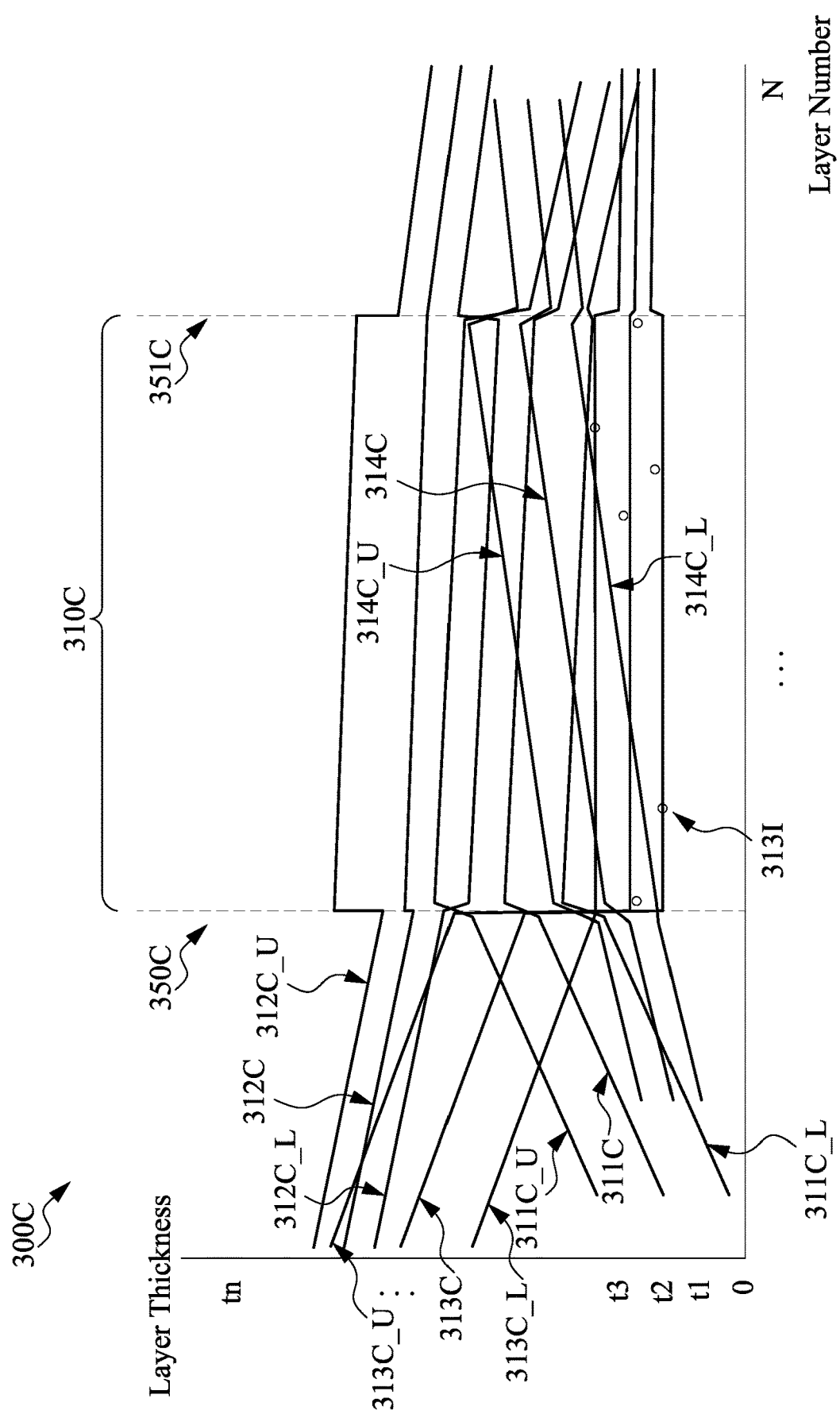
Figure 3D:
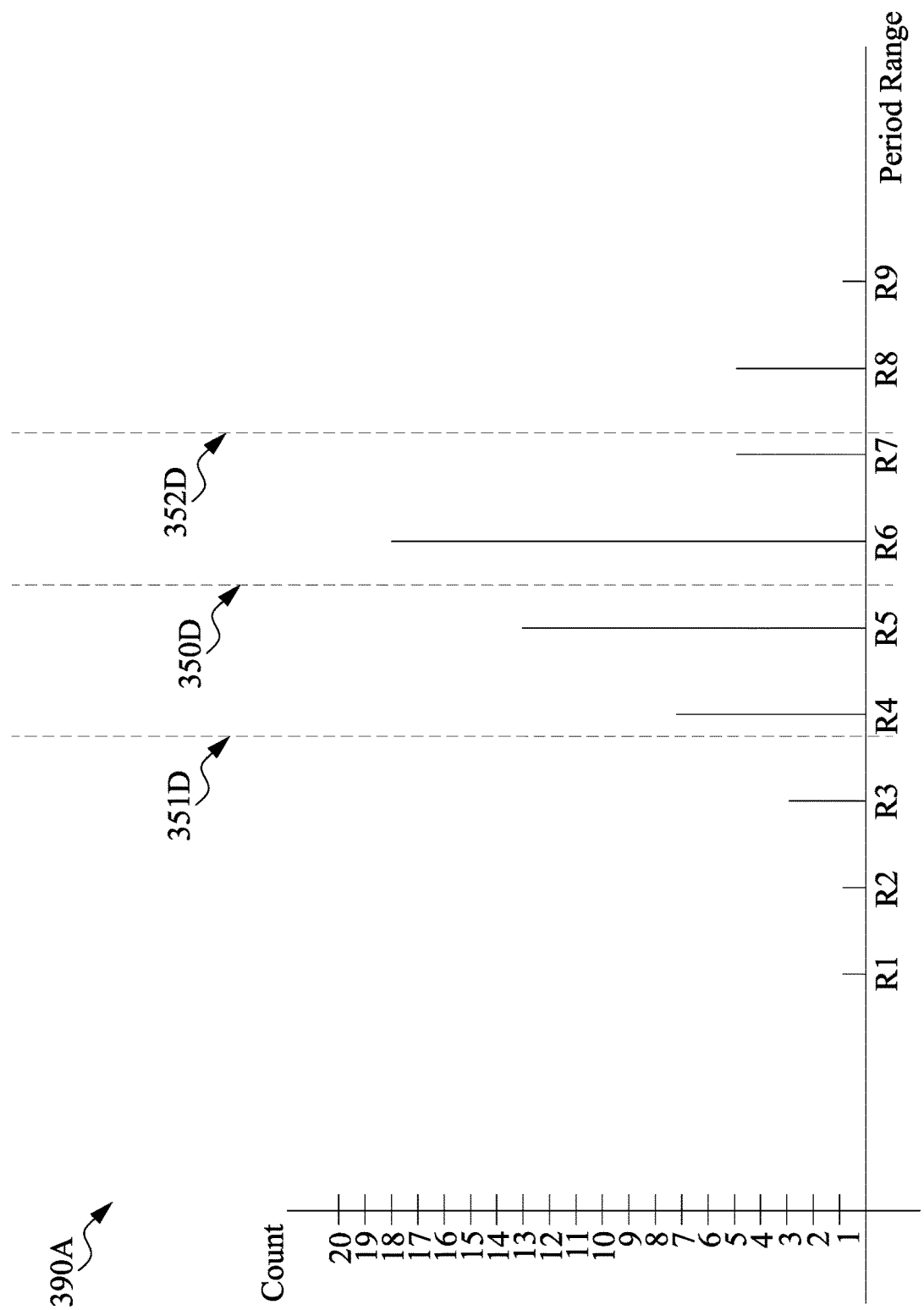

FIG. 3D illustrates a histogram plot 390A corresponding to the graph 300A of FIG. 3A, which may further aid in describing the thickness variation across all layers in the reflective multilayer 20A. The histogram plot 390 of the reflective multilayer 20A includes a number of non-overlapping thickness ranges R1-R9. Each thickness range of the thickness ranges R1-R9 may be about 1 Angstrom wide, for example, without excluding other appropriate widths greater or less than about 1 Angstrom. A line 350D is illustrative of the average thickness of the material layers 11, 12. Lines 351D, 352D represent one standard deviation below and above the average thickness, respectively. As a non-limiting example, the average thickness represented by the line 350D may be about 69.5 nm, and the standard deviation may be about 1.5 nm, corresponding to thickness variation of about 2.2%.

In FIG. 3B, a graph 300B depicts a first line 311B, a second line 312B, and a third line 313B corresponding to average thicknesses of the first material layers 11, the second material layers 12, and the third material layers 13, respectively, of the reflective multilayer 20B of FIGS. 2C-2D. Upper band lines 311B_U, 312B_U, 313B_U illustrate upper thickness deviations from the average thicknesses illustrated by the first, second and third lines 311B, 312B, 313B, respectively. In some embodiments, the upper thickness deviations are a maximum deviation, a first deviation, or another deviation therebetween. Lower band lines 311B_L, 312B_L, 313B_L illustrate lower thickness deviations from the average thicknesses illustrated by the first, second, and third lines 311B, 312B, 313B, respectively. In some embodiments, the lower thickness deviations are a maximum deviation, a first deviation, or another deviation therebetween.

In some embodiments, the first material layers 11 do not necessarily alternate with the second material layers 12 and/or the third material layers 13, and each of the first, second and third material layers 11, 12, 13 has arbitrary thickness. In some embodiments, the first material layers 11 are substantially all thinner than the second material layers 12. For example, more than 90% of the second material layers 12 may be thicker than the thickest first material layer 11. In some embodiments, more than 90% of the second material layers 12 are thicker than an average thickness of the first material layers 11. In some embodiments, the third material layers 13 are substantially all thinner than the second material layers 12. For example, more than 90% of the second material layers 12 may be thicker than the thickest third material layer 13 (this case is not specifically illustrated in FIG. 3B). In some embodiments, more than 90% of the second material layers 12 are thicker than an average thickness of the third material layers 13. Generally, as can be understood from FIG. 3B, the reflector layers 11, 13 illustrated by the lines 311B, 313B are not as thick as the spacer layers 12. However, a small minority (e.g., <10%) of the reflector layers 11, 13 may have thickness greater than an average thickness of the spacer layers 12.

Further to FIG. 3B, five different regions 301B-305B are depicted, which highlight certain characteristics of composition of the reflective multilayer 20B regarding ordering and relative thicknesses of the first, second and third material layers 11-13. In a first region 301B left of a line 350B, only layers of the third material layers 13 and the second material layers 12 are included. No intermediate layers of the first material layers 11 are present in the first region 301B. In some embodiments, the first region 301B may include only layers of the first and second material layers 11, 12, with no intermediate layers of the third material layers 13 present. Further, average thickness of the second and third material layers 12, 13 are about similar (e.g., within about 20% of each other) in the first region 301B.

In a second region 302B between lines 350B and 351B, layers of the first material layers 11 are first present in the reflective multilayer 20B. Thicknesses of the third material layers 13 have a magnitude slope trend that is downward, and thicknesses of the first and second material layers 11, 12 each have a magnitude slope trend that is generally upward in the second region 302B.

In a third region 303B between lines 351B and 352B, most (e.g., >90%) of the reflector layers 11, 13 have thickness substantially lower than the spacer layers 12. In some embodiments, the average thickness of either of the reflector layers 11, 13 is at least about 20% thinner than the average thickness of the spacer layers 12. In some embodiments, the first material layers 11 are generally thicker than the third material layers 13 in the third region 303B, such that average thickness of the first material layers 11 is at least about 10% greater than average thickness of the third material layers 13.

In a fourth region 304B between lines 352B and 353B, the second and third material layers 12, 13 have magnitude slope trend that is generally sideways, and low thickness variation. The first material layers 11 have high thickness variation, and sideways magnitude slope trend. The average thickness of the second material layers 12 is greater than the average thickness of the first material layers 11, which is in turn greater than the average thickness of the third material layers 13.

In a fifth region 305B right of line 353B, the first, second, and third material layers 11-13 all exhibit substantially sideways magnitude slope trend and low thickness variation. In some embodiments, the reflective multilayer 20B has the least thickness variation in the region most distal the surface on which light is incident, such as the fifth region 305B.

In FIG. 3C, a graph 300C depicts a first line 311C, a second line 312C, a third line 313C, and a fourth line 314C corresponding to average thicknesses of the first material layers 11, the second material layers 12, and the third material layers 13, and the fourth material layer 14, respectively, of the reflective multilayer 20C of FIGS. 2E-2F. Upper band lines 311C_U, 312C_U, 313C_U, 314C_U illustrate upper thickness deviations from the average thicknesses illustrated by the first, second, third and fourth lines 311C, 312C, 313C, 314C, respectively. In some embodiments, the upper thickness deviations are a maximum deviation, a first deviation, or another deviation therebetween. Lower band lines 311C_L, 312C_L, 313C_L, 314C_L illustrate lower thickness deviations from the average thicknesses illustrated by the first, second, third and fourth lines 311C, 312C, 313C, 314C respectively. In some embodiments, the lower thickness deviations are a maximum deviation, a first deviation, or another deviation therebetween.

As each of the material layers 11-14 may have arbitrary thickness and ordering in the reflective multilayer 20C, the graph 300C may be similar in many respects to either or both of the graphs 300A, 300B. A region 301C of the reflective multilayer 20C, which may be an intermediate region, is highlighted in FIG. 3C for purposes of illustration. In some embodiments, an intermediate region 301C may include very few of at least one of the material layers 11-14. As illustrated in FIG. 3C, in some embodiments, the reflective multilayer 20C includes an intermediate region 301C having sparse layers (represented by points 313I) of the third material layers 13, which are reflector layers. In some embodiments, this may be due to intelligent recombination of adjacent reflector layers of different materials into a single reflector layer of a single material (further described with reference to FIGS. 6A-6B), such as the first material layers 11, which may be molybdenum layers. This further highlights the aperiodicity of the reflective multilayer 20C, in which some reflector/spacer bilayers may include all four material layers 11-14, and others may include only three material layers, e.g., the material layers 11, 12, 14. In some embodiments, in at least one region of the reflective multilayer 20C, presence of at least one of the material layers, such as the material layer 13, may be in a range of about 1% of total layers in the region to about 15% of total layers in the region. Having at least one of the material layers present at a percentage in the range described may improve manufacturing yield and cost, while maintaining high reflectivity of the reflector 100 including the reflective multilayer 20C. In some embodiments, total number of layers of the region is in a range of about 20 layers to about 100 layers.

Figure 4:
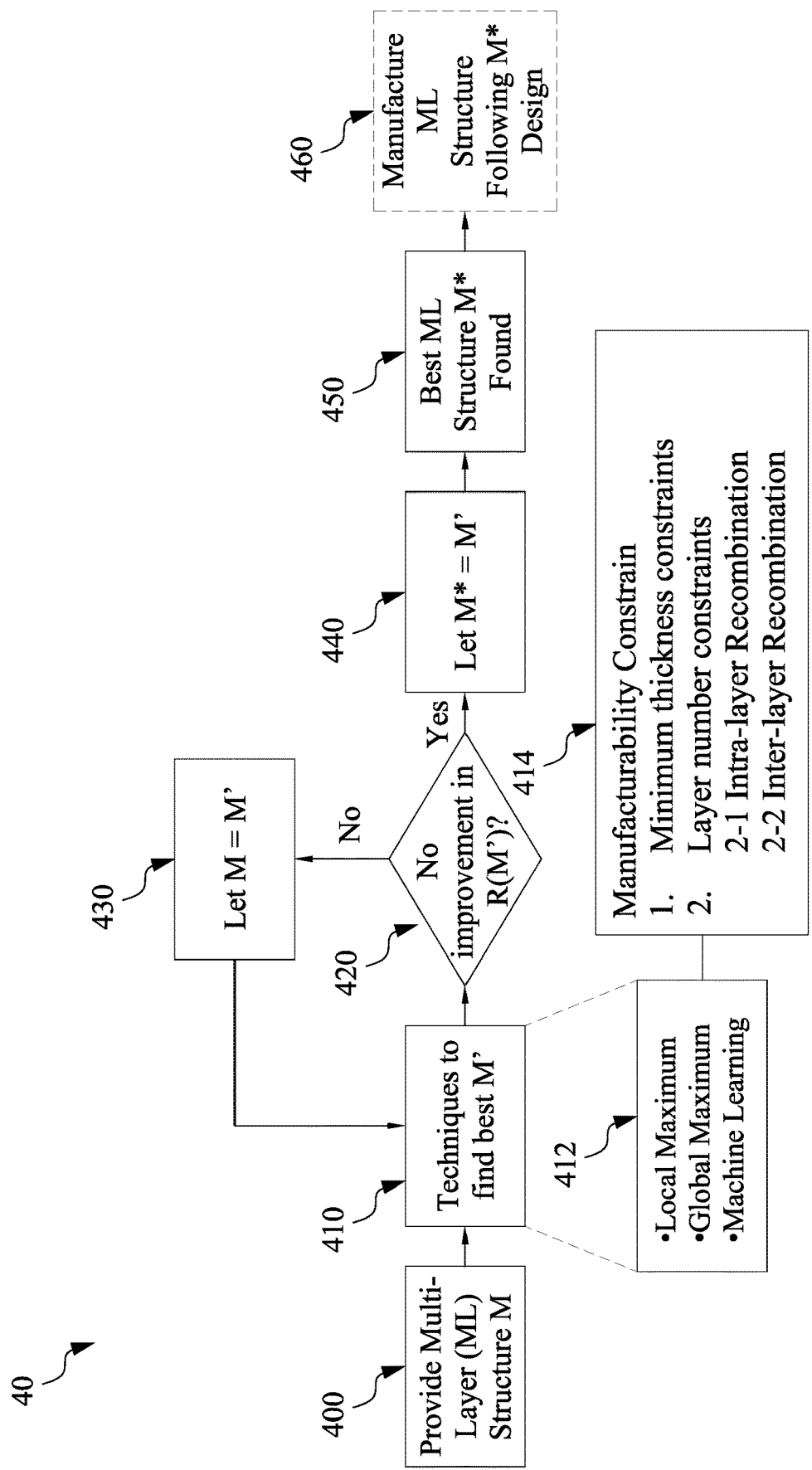
Figure 5:
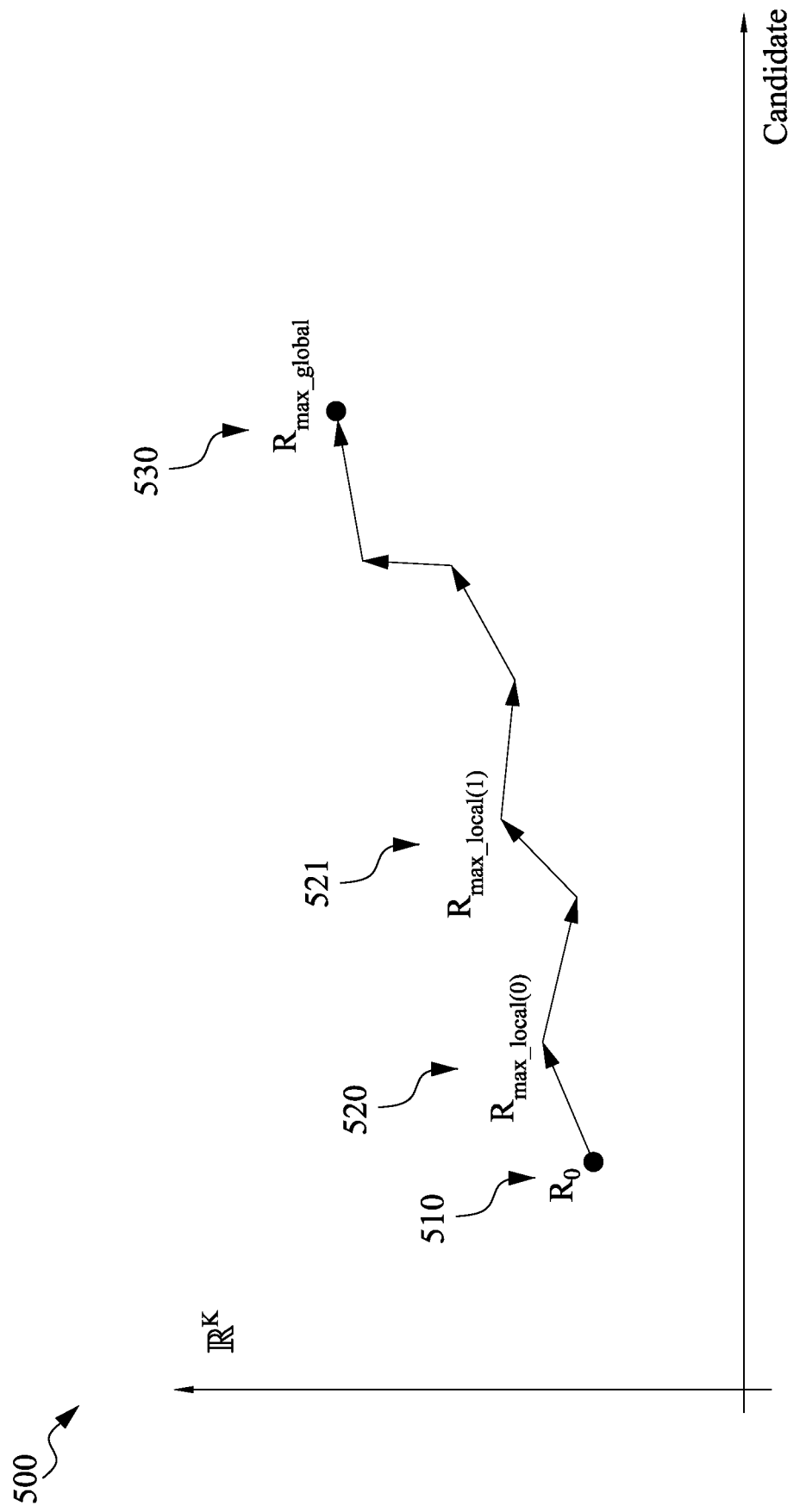
Figures 6A, 6B:
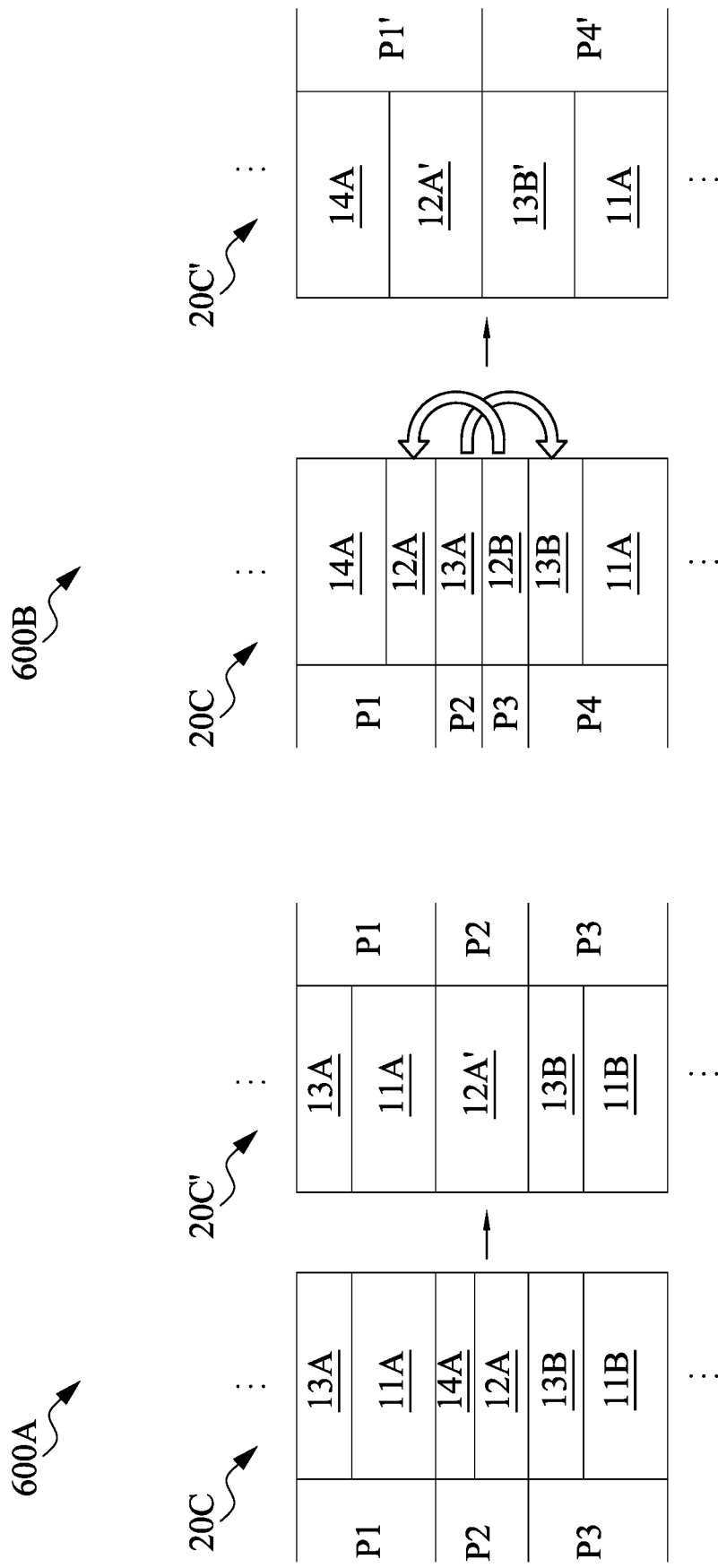

FIGS. 4-6B are various views illustrating a process 40 for forming a reflective multilayer in accordance with various embodiments. FIG. 4 is a flowchart of the process 40, FIG. 5 illustrates a plot corresponding to operation 412 of FIG. 4, and FIGS. 6A-6B are views illustrating recombination of first, second, third, and/or fourth material layers 11-14 corresponding to operation 414 of FIG. 4. The process 40 may be performed by a computing system, which may include a processor, such as a general purpose central processing unit (CPU), a graphics processing unit (GPU), or an application-specific integrated circuit (ASIC), random access memory (RAM), and at least one communications bus configured to provide two-way signal transfer between the processor and the RAM.

In FIG. 4, the process 40 begins with operation 400 in which a reflective multilayer structure M is provided, which may also be referred to as an "initial reflective multilayer structure M." In some embodiments, the reflective multilayer structure M is provided by establishing a data object including an array or list of data structures representing individual material layers. In some embodiments, each data structure includes at least position (e.g., integer 0 to 99), material (e.g., molybdenum, silicon, etc.), and thickness (e.g., 30 nm) of the represented material layer. In some embodiments, each data structure includes a depth (e.g., 0.00 nm to 50000.00 nm), which may be recorded instead of the position, or in addition to the position.

In some embodiments, the reflective multilayer structure M is further provided in operation 400 by establishing design constraints (or rules) related to the positions, depths, materials, and thicknesses of the material layers. For example, a minimum and/or maximum thickness may be set for each material based on manufacturing capability, and/or a maximum total quantity of layers may be set, and/or a material selection exclusion may be set based on material of an immediately previous assigned material layer. The material selection exclusion may be a rule established that reduces the pool of available materials for a layer during randomization. For example, if the material of the first material layers 11 is randomly selected for a first layer, the material selection exclusion may remove the material of the first material layer 11 from consideration for the immediately subsequent second layer, such that the material of the second layer may only be randomly chosen from the materials corresponding to the second, third, or fourth material layers 12-14. In another example, removal may be based the first layer being a reflector layer 11, 13 or a spacer layer 12, 14, such that the second layer may only be a spacer layer 12, 14 or a reflector layer 11, 13, respectively.

In some embodiments, the reflective multilayer structure M is further provided by assigning a random value to at least one of the material or thickness for each position. For example, a material layer in position 0 may be randomly assigned molybdenum as the material, and may be randomly assigned 22 nm as the thickness. Then, a material layer in position 1 may be randomly assigned silicon as the material, and may be assigned a fixed thickness of 40 nm as the thickness. A material layer in position 2 may be randomly assigned molybdenum with a thickness of 25 nm. This assignment operation may continue until either a fixed quantity of layers is reached, or a randomized quantity (e.g., 75) of layers between a minimum quantity (e.g., 60) and a maximum quantity (e.g., 100) is reached.

In some embodiments, a periodic, alternating configuration may be assigned to the layers of the reflective multilayer structure M. For example, the configuration may include a fixed quantity of alternating layers of the first, second, third, and fourth material layers 11-14, each having the same thickness. Choosing such a configuration may significantly reduce processing burden for the operation 400.

In operation 410, at least one technique is employed to find a best intermediate reflective multilayer structure M' (or "intermediate reflective multilayer structure configuration M'"). Techniques 412 may include inverse design techniques, such as a local maximum path finding algorithm, a global maximum path finding algorithm, and/or a machine learning algorithm. As described above, the techniques 412 may be constrained by manufacturability constraints 414, which may include at least minimum thickness constraints and layer number constraints. The manufacturing constraints 414 may inform further techniques, such as intra-layer recombination and/or inter-layer recombination, which are described more fully with reference to FIGS. 6A-6B.

FIG. 5 illustrates the local and global maximum path finding algorithms, corresponding to operations 420, 430, 440, 450 of FIG. 4. In FIG. 5, a plot is shown with reflectivity on the vertical axis, and candidates on the horizontal axis. Each of the initial reflective multilayer structure M, and subsequent intermediate reflective multilayer structures M', are candidates.

In some embodiments, the local maximum path finding algorithm may receive the initial reflective multilayer structure M or an intermediate reflective multilayer structure M', alter at least one parameter (position, depth, material, thickness) of at least one of the material layers, and calculate reflectivity R by the technique described with reference to FIG. 1C, corresponding to operation 410 of FIG. 4. Each cycle of alteration of the initial or intermediate reflective multilayer structure M, M' and corresponding calculation of the reflectivity R may be referred to as a path finding cycle. In some embodiments, a quantity of path finding cycles may be set, such as 1000 cycles, 10000 cycles, or another appropriate quantity of path finding cycles, after which the path finding algorithm may be terminated, and a best reflective multilayer structure M* of all path finding cycles may be determined and saved for use in manufacturing a reflector 100. In some embodiments, the path finding algorithm terminates after a quantity of path finding cycles in which no significant improvement is found, e.g., 100 cycles, 10 cycles, or another suitable number of cycles, which may correspond to transition from operation 420 to operation 430 in FIG. 4.

In some embodiments, the alteration may be applied to a single layer, altering the material, position, depth or thickness of the layer. In some embodiments, the alteration may be applied to multiple layers. In some embodiments, the alteration is randomized. For example, the alteration may affect a random quantity of the layers, and/or material, position, depth, and/or thickness of each of the layers. In some embodiments, the alteration may include swapping layers. For example, a first layer in position 0 and a second layer in position 50 may be swapped, such that the first layer after alteration occupies position 50, and the second layer occupies position 0. In some embodiments, the alteration is constrained by the manufacturability constraints 414. In some embodiments, the alteration includes addition or removal of layers. For example, the second layer in position 50 may be removed, such that a third layer originally in position 51 occupies the position 50 after alteration, and total quantity of layers of the intermediate reflective multilayer structure M' is reduced by one.

Some alterations improve reflectivity, and other alterations degrade reflectivity, which may correspond to operation 420 of FIG. 4. For example, as shown in FIG. 5, one or more alterations are performed on the initial reflective multilayer structure M, reflectivity improves (corresponding to the transition from operation 420 to operation 430 in FIG. 4), and a first local maximum 520 is found having reflectivity $R_{max\_local(0)}$, which is greater than initial reflectivity $R_0$ of the initial reflective multilayer structure M. In some embodiments, a number of alterations (or alteration/calculation cycles, e.g., >100 cycles) occur before reaching an alteration that degrades the reflectivity of the intermediate reflective multilayer structure M'. The first local maximum 520 may correspond to a last best intermediate reflective multilayer structure M' prior to an immediately subsequent degrading alteration. Each intermediate reflective multilayer structure M' may be stored in the RAM, including the parameters of all layers and the calculated reflectivity.

FIG. 5 further illustrates the global maximum path finding algorithm. Following identification of the first local maximum 520, a number of path finding cycles may result initially in degradation of the reflectivity R, followed by a number of path finding cycles that result in improvement in the reflectivity R. After one or more path finding cycles that improve the reflectivity R, a second local maximum 521 may be identified having reflectivity $R_{max\_local(1)}$ that is greater than reflectivity $R_{max\_local(0)}$ corresponding to the first local maximum 520. Again, a number of path finding cycles may pass in which reflectivity R is degraded, followed by a number of path finding cycles that culminate in identification of a global maximum 530 corresponding to reflectivity of $R_{max\_global}$, which is greater than any other local maximum 520, 521 in the plot 500. Identification and recordation/storage of the best reflective multilayer structure M* corresponding to the global maximum 530 may correspond to operation 420 and operation 440, respectively, of FIG. 4. The process 40 may terminate at operation 450 upon identification and recordation/storage of the best reflective multilayer structure M*.

In some embodiments, it may be desirable to escape a local maximum, such as the first local maximum 520, if a number of path finding cycles pass in which no marked improvement is made in the reflectivity R by altering the layers of the intermediate reflective multilayer structure M'. To escape the local maximum, a strong alteration may be applied, in which a significant number of layers are affected by the strong alteration. For example, a strong alteration may include simultaneously randomizing position, material, and/or thickness of at least 10% of the layers of the intermediate reflective multilayer structure M'. Applying a strong alteration may initially cause a significant degradation of the reflectivity R, followed by a vigorous improvement in the reflectivity R in subsequent path finding cycles.

In some embodiments, following operation 450 in which the best reflective multilayer structure M* is recorded/stored, a reflective multilayer, such as one of the reflective multilayers 20A-20C, is manufactured following the design of the recorded/stored best reflective multilayer structure M*, corresponding to operation 460 of FIG. 4. For example, the best reflective multilayer structure M* may be a digital file(s) containing information on positions, materials, and thicknesses of the material layers 11-14, such as is represented in graphical form in FIG. 3B.

In some embodiments, operation 460 includes depositing a first material layer having a first material and a first thickness, depositing a second material layer having a second material and a second thickness, and so on, until all material layers 11-12, 11-13, 11-14 of the reflective multilayer 20A-20C, respectively, are deposited. Further manufacturing operations may be performed on the completed reflective multilayer 20A-20C, such as addition of a capping layer, or packaging of the reflective multilayer 20A-20C, for example, in a protective package.

Turning to FIGS. 6A-6B, in some embodiments, recombination is performed on at least two layers in the intermediate reflective multilayer structure M', typically neighboring or nearby layers, as part of the operation 410. Recombination may achieve a number of benefits, including recovering layer quantity budget when the intermediate reflective multilayer structure M' is at or near the layer number constraint. In some embodiments, the layer number constraint is a maximum quantity of layers that may be included in the best reflective multilayer structure M* corresponding to the reflective multilayers 20A-20C. Recombination may also improve manufacturing yield, for example, by combining at least one layer at the minimum thickness constraint with another layer, resulting in a single, thicker layer, which is generally easier to manufacture with high uniformity.

FIG. 6A illustrates an intra-layer recombination 600A in accordance with various embodiments. As shown, the reflective multilayer 20C includes three periods P1, P2, P3, each including two layers. The first period P1 includes third material layer 13A overlying first material layer 11A. The second period P2 includes fourth material layer 14A underlying the first material layer 11A and overlying second material layer 12A. The third period P3 includes third material layer 13B underlying the second material layer 12A and overlying first material layer 11B. The fourth and second material layers 14A, 12A of the second period P2 are both spacer layers 12, 14, but are different materials, and have different thicknesses. First thickness of the fourth material layer 14A may be at or near the minimum thickness constraint, and second thickness of second material layer 12A is significantly thicker than the first thickness. As such, the fourth material layer 14A may be recombined with the second material layer 12A to form a recombined second material layer 12A' having thickness substantially equal to the sum of the first and second thicknesses. In some embodiments, the intra-layer recombination 600A includes removing one layer, such as the fourth material layer 14A, and increasing thickness of another layer, such as the second material layer 12A. In some embodiments, the intra-layer recombination 600A includes altering the material of one layer, such as the fourth material layer 14A from strontium to silicon, and merging the one layer with another layer, such as the second material layer 12A. The intra-layer recombination 600A resulting in the recombined second material layer 12A' removes one manufacturing operation (one layer instead of two), removes a relatively difficult layer to manufacture, and thickens a relatively easy layer to manufacture, making it even easier to manufacture.

FIG. 6B illustrates an inter-layer recombination 600B in accordance with various embodiments. As shown, the reflective multilayer 20C includes four periods P1, P2, P3, P4 each including one or two layers. The first period P1 includes fourth material layer 14A overlying second material layer 12A. The second period P2 includes third material layer 13A underlying the second material layer 12A. The third period P3 includes second material layer 12B underlying the third material layer 13A. The fourth period P4 includes third material layer 13B underlying the second material layer 12B and overlying first material layer 11A. The third and second material layers 13A, 12B may be at or near the minimum thickness constraint. As such, it may be desirable from a manufacturing standpoint to recombine the relatively thin second and third material layers 12B, 13A with the relatively thick second and third material layers 12A, 13B, respectively.

Following inter-layer recombination 600B, the reflective multilayer 20C' includes two fewer periods: a first period P1' and a fourth period P4'. The first period P1' may include the original fourth material layer 14A, and recombined second material layer 12A' having thickness substantially equal to the sum of thicknesses of the second material layers 12A, 12B. The fourth period P4' may include the original first material layer 11A, and recombined third material layer 13B' having thickness substantially equal to the sum of thicknesses of the third material layers 13A, 13B. In some embodiments, the inter-layer recombination 600B includes removing two layers, such as the third material layer 13A and the second material layer 12B, and increasing thickness of two layers, such as the second material layer 12A and the third material layer 13B. In some embodiments, the inter-layer recombination 600B includes altering the positions of two layers, such as swapping the positions of the third material layer 13A and the second material layer 12B, and merging the swapped layers with another two layers, such as third material layer 13B and the second material layer 12A, respectively. The inter-layer recombination 600B resulting in the recombined second material layer 12A' and the recombined third material layer 13B' removes two manufacturing operations (two layers instead of four), removes two relatively difficult layers to manufacture, and thickens two relatively easy layers to manufacture, making them even easier to manufacture.

In some embodiments, the recombination 600A, 600B results in a small but measurable degradation in the reflectivity of the reflective multilayer 20A-20C. As such, the recombination 600A, 600B may be kept when the resulting degradation of reflectivity of the reflective multilayer 20A-20C is less than about 0.01%. For a lithography exposure system 10 including at least ten reflectors 100, and assuming ten recombinations per reflector 100, degradation over the optical path is about 1%. In some embodiments, a recombination budget may be established, whereby overall degradation of reflectivity of the reflector 100 is not to exceed a threshold, such as about 0.1%, such that degradation over the optical path including ten reflectors 100 does not exceed about 1%. In some embodiments, when the degradation due to recombination is greater than about 0.01%, the recombination is discarded.

Figure 7:
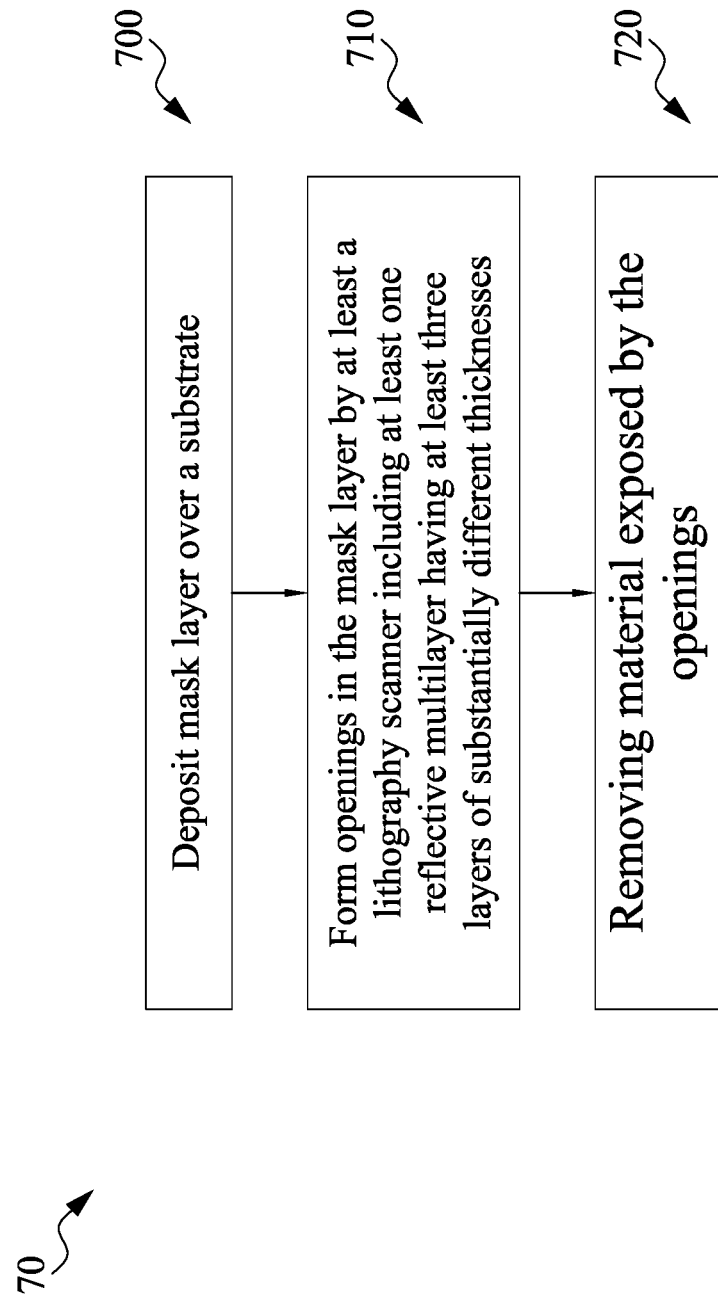
FIG. 7 is a view illustrating a method of fabricating a semiconductor device according to various aspects of the present disclosure.

FIG. 7 is a flowchart of a process 70 of manufacturing a semiconductor device by the lithography exposure system 10 including at least one of the reflective multilayers 20A-20C. A mask layer is deposited over a substrate in operation 700. The mask layer may include a hard mask (e.g., SiN), and one or more photoresist layers, which may include an anti-reflective layer. The semiconductor device generally includes patterned layers of semiconductor, dielectric, and conductor materials on and in the substrate. The mask layer may be deposited over a layer of material prior to patterning by, for example, an etching system. The deposition may include any suitable deposition process, such as CVD, PVD, spin coating, or the like.

Following deposition of the mask layer, in operation 710, openings are formed in the mask layer by the lithography exposure system 10 including at least one reflective multi-layer 20A, 20B, 20C having at least three layers of substantially different thicknesses. As described with reference to FIGS. 2F-2L, position, depth, material, and thickness of the first, second, third, and fourth material layers 11-14 may be aperiodic and non-alternating. The openings may be formed by exposing the mask layer to a pattern of the mask stage 16, then removing exposed or unexposed portions of the mask layer. Following removal of the exposed or unexposed portions, the remainder of the mask layer includes the openings.

Following formation of the openings, in operation 720, material exposed by the openings is removed. The material may be material of the hard mask exposed by the openings in the photoresist layer(s). The material may be material of a semiconductor, dielectric, or conductor layer exposed by the openings in the photoresist layer(s). The process 70 may be repeated multiple times to pattern a single layer, and may also be repeated multiple times to pattern multiple layers of the semiconductor device.

Figure 8:
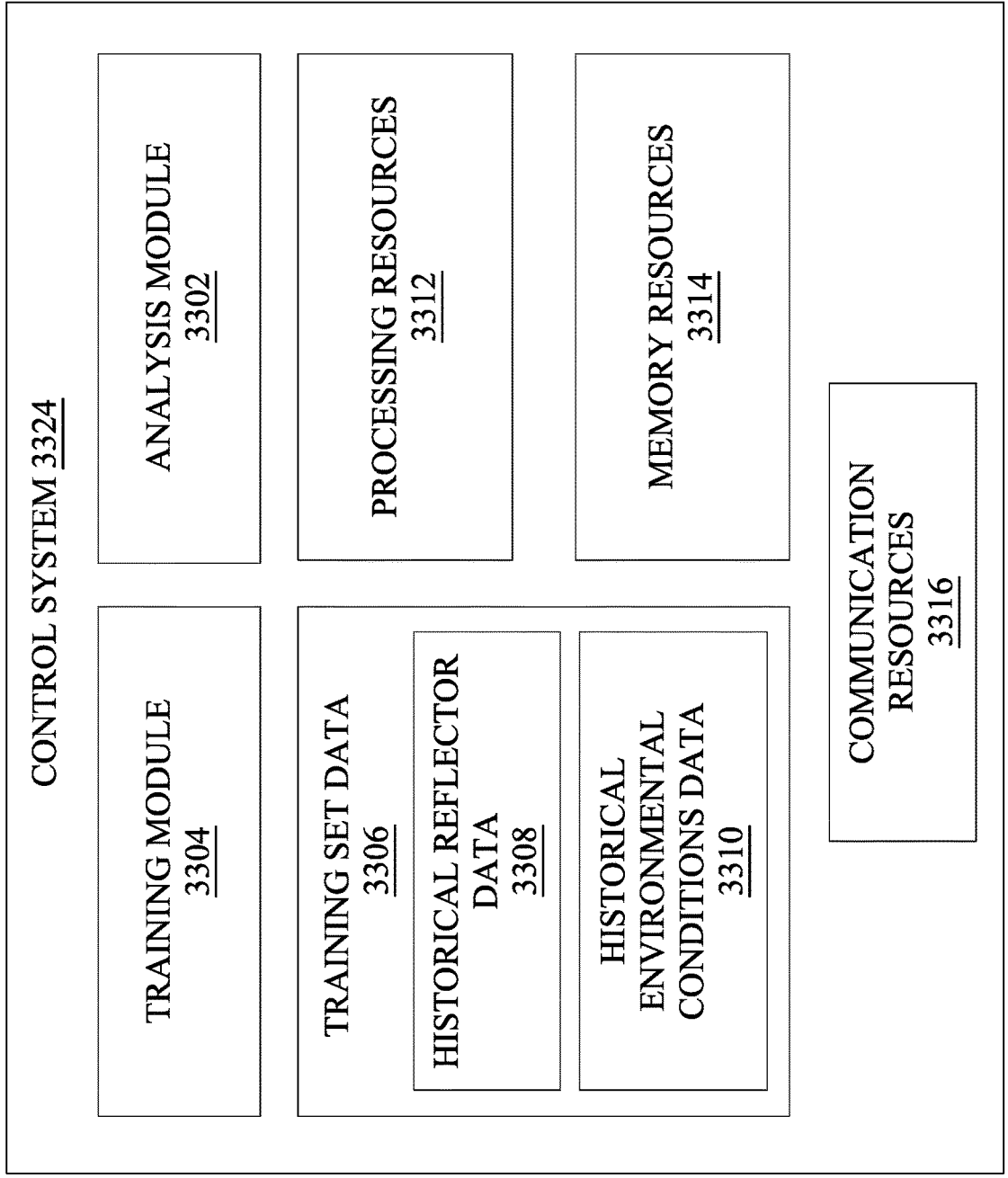
FIGS. 8-9 are views illustrating a method of fabricating a mirror structure by a machine learning process according to various aspects of the present disclosure.

FIG. 8 is a block diagram of a system 3324, which may be a control system for performing the process 40 of FIG. 4, according to one embodiment. The control system 3324 utilizes machine learning to adjust parameters of the intermediate reflective multilayer structures M'.

In one embodiment, the control system 3324 includes an analysis model 3302 and a training module 3304. The training module 3304 trains the analysis model 3302 with a machine learning process. The machine learning process trains the analysis model 3302 to select parameters for the operation 410 that will result in intermediate reflective multilayer structures M' having selected characteristics, such as high reflectivity R. Although the training module 3304 is shown as being separate from the analysis model 3302, in practice, the training module 3304 may be part of the analysis model 3302.

The control system 3324 includes, or stores, training set data 3306. The training set data 3306 includes historical reflector data 3308 and historical environmental conditions data 3310. The historical reflector data 3308 includes data related to intermediate reflective multilayer structures M' resulting from operation 410. The historical environmental conditions data 3310 includes data related to simulated environment in which the intermediate reflective multilayer structure M' is to be operated. As will be set forth in more detail below, the training module 3304 utilizes the historical reflector data 3308 and the historical environmental conditions data 3310 to train the analysis model 3302 with a machine learning process.

In one embodiment, the historical reflector data 3308 includes data related to the position, depth, material, and/or thickness of material layers. For example, thousands or millions of intermediate reflective multilayer structures M' may be generated (initialized or altered) over the course of several hours or days. Each of the intermediate reflective multilayer structures M' may include material layers of varying thicknesses, materials, and positions and/or depths. After each generation, the reflectivity of the intermediate reflective multilayer structures M' are calculated. The historical reflector data 3308 includes the parameters of each of the layers of each of the intermediate reflective multilayer structures M' generated by, for example, operation 410. Accordingly, the historical reflector data 3308 can include thickness, material, depth and position data for a large number of intermediate reflective multilayer structures M' generated by operation 410.

In one embodiment, the historical reflector data 3308 may also include data related to recombination of material layers in operation 410. For example, an alteration process may include a large number of recombinations during which individual material layers of the intermediate reflective multilayer structures M' are merged and/or rearranged. The historical reflector data 3308 can include reflectivity data for intermediate reflective multilayer structures M' after individual path finding cycles or groups of path finding cycles. Thus, the historical reflector data 3308 not only includes data related to the total reflectivity of an intermediate reflective multilayer structures M' after completion of a path finding process, but may also include data related to the reflectivity of the intermediate reflective multilayer structures M' at various stages of the path finding process.

In one embodiment, the historical environmental conditions data 3310 include various environmental conditions or parameters during operation of the intermediate reflective multilayer structures M' associated with the historical reflector data 3308. Accordingly, for each intermediate reflective multilayer structure M' having data in the historical reflector data 3308, the historical environmental conditions data 3310 can include the environmental conditions or parameters that were present during calculation of the reflectivity. For example, the historical environmental conditions data 3310 can include data related to the ambient atmosphere, angle of incidence of incident light, wavelength of incident light, position in the optical path of the intermediate reflective multilayer structure M', and the like.

In one embodiment, the training set data 3306 links the historical reflector data 3308 with the historical environmental conditions data 3310. In other words, the material layer thicknesses, material compositions, layer depths, or positions associated with an intermediate reflective multilayer structure M' in the historical reflector data 3308 is linked (e.g., by labeling) to the environmental conditions data 3310 and reflectivity data associated with that intermediate reflective multilayer structure M'. As will be set forth in more detail below, the labeled training set data can be utilized in a machine learning process to train the analysis model 3302 to predict material layer conditions that will result in highly reflective reflectors 100.

In one embodiment, the control system 3324 includes processing resources 3312, memory resources 3314, and communication resources 3316. The processing resources 3312 can include one or more controllers or processors. The processing resources 3312 are configured to execute software instructions, process data, make thin-film etching control decisions, perform signal processing, read data from memory, write data to memory, and to perform other processing operations. The processing resources 3312 can include physical processing resources 3312 and/or virtual processing resources 3312. The processing resources 3312 can include cloud-based processing resources including processors and servers accessed via one or more cloud computing platforms.

In one embodiment, the memory resources 3314 can include one or more computer readable memories. The memory resources 3314 are configured to store software instructions associated with the function of the control system and its components, including, but not limited to, the analysis model 3302. The memory resources 3314 can store data associated with the function of the control system 3324 and its components. The data can include the training set data 3306, current process conditions data, and any other data associated with the operation of the control system 3324 or any of its components. The memory resources 3314 can include physical memory resources and/or virtual memory resources. The memory resources 3314 can include cloud-based memory resources accessed via one or more cloud computing platforms.

In one embodiment, the communication resources 3316 can include wired and wireless communication resources, which can facilitate communication via one or more networks such as wired networks, wireless networks, the Internet, or an intranet. The communication resources 3316 can enable components of the control system 3324 to communicate with each other.

Figure 9:
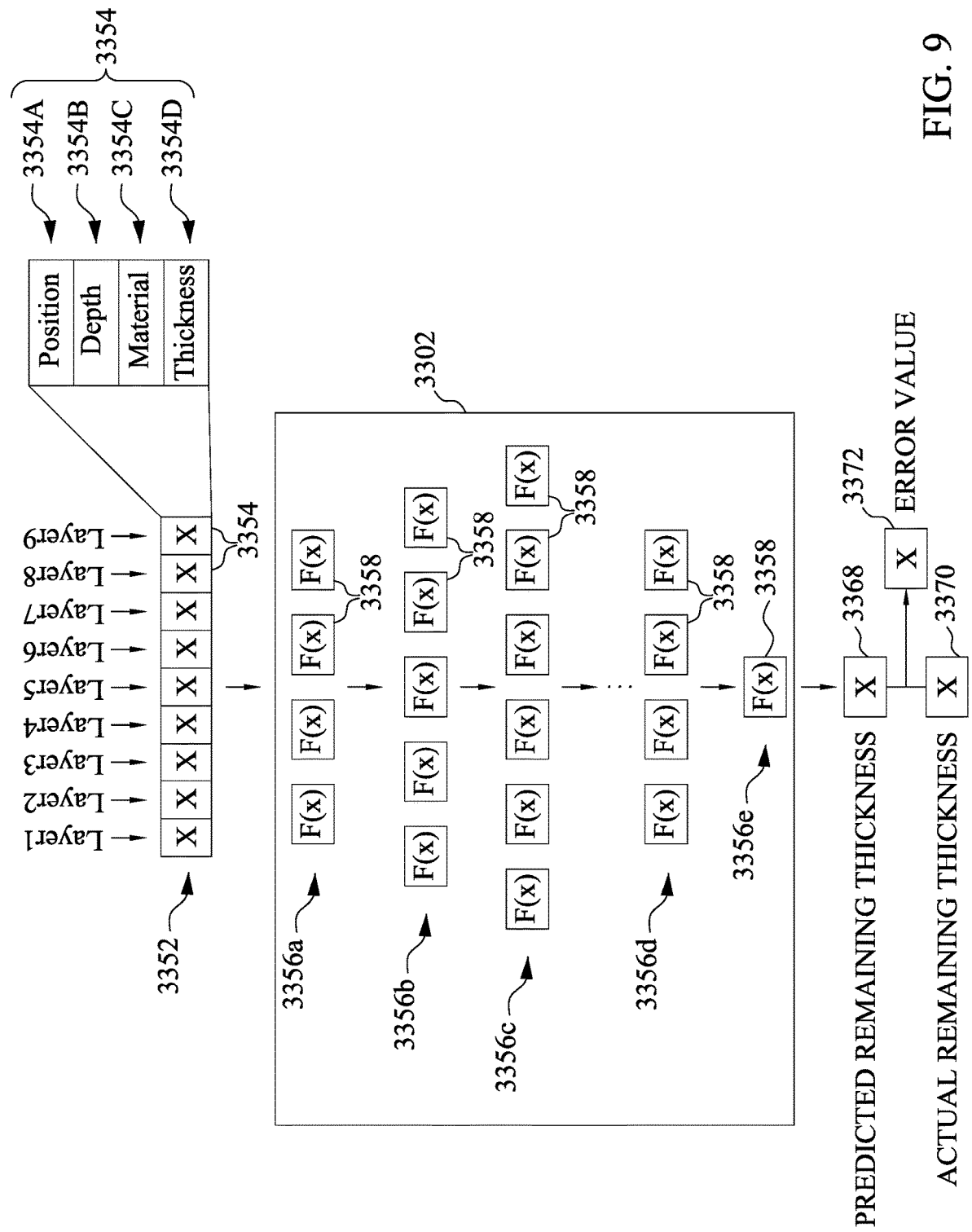

FIG. 9 is a block diagram illustrating operational aspects and training aspects of the analysis model 3302 of FIG. 8, according to one embodiment. As described previously, the training set data 3306 includes data related to a plurality of previously generated intermediate reflective multilayer structures M'. Each previously generated intermediate reflective multilayer structure M' was generated with particular environmental conditions and resulted in a particular reflectivity. The material layer positional, depth, material, and thickness parameters for each previously generated intermediate reflective multilayer structure M' are formatted into a respective reflector conditions matrix 3352. The reflector conditions matrix 3352 includes a plurality of data vectors 3354. Each data vector 3354 corresponds to a particular layer, and includes at least four data scalars 3354A-3354D, which may include a position scalar 3354A, a depth scalar 3354B, a material scalar 3354C, and a thickness scalar 3354D.

The example of FIG. 9 illustrates a single reflector conditions matrix 3352 that will be passed to the analysis model 3302 during the training process. In the example of FIG. 9, the reflector conditions matrix 3352 includes nine data vectors 3354, each corresponding to an individual material layer of the intermediate reflective multilayer structure M'. Each data scalar 3354A-3354D is represented by a numerical value in the corresponding data vector 3354. For condition types that are not naturally represented in numbers, such as material 3354C, a number can be assigned to each possible material.

The analysis model 3302 includes a plurality of neural layers 3356a-e. Each neural layer includes a plurality of nodes 3358. Each node 3358 can also be called a neuron. Each node 3358 from the first neural layer 3356a receives the data values for each data field from the reflector conditions matrix 3352. Accordingly, in the example of FIG. 9, each node 3358 from the first neural layer 3356a receives 36 data values because the reflector conditions matrix 3352 has 36 data scalars (9*4=36). Each neuron 3358 includes a respective internal mathematical function labeled F(x) in FIG. 9. Each node 3358 of the first neural layer 3356a generates a scalar value by applying the internal mathematical function F(x) to the data values from the data fields 3354 of the reflector conditions matrix 3352. Further details regarding the internal mathematical functions F(x) are provided below.

Each node 3358 of the second neural layer 3356b receives the scalar values generated by each node 3358 of the first neural layer 3356a. Accordingly, in the example of FIG. 9 each node of the second neural layer 3356b receives four scalar values because there are four nodes 3358 in the first neural layer 3356a. Each node 3358 of the second neural layer 3356b generates a scalar value by applying the respective internal mathematical function F(x) to the scalar values from the first neural layer 3356a.

Each node 3358 of the third neural layer 3356c receives the scalar values generated by each node 3358 of the second neural layer 3356b. Accordingly, in the example of FIG. 9 each node of the third neural layer 3356c receives five scalar values because there are five nodes 3358 in the second neural layer 3356b. Each node 3358 of the third neural layer 3356c generates a scalar value by applying the respective internal mathematical function F(x) to the scalar values from the nodes 3358 of the second neural layer 3356b.

Each node 3358 of the neural layer 3356d receives the scalar values generated by each node 3358 of the previous neural layer (not shown). Each node 3358 of the neural layer 3356d generates a scalar value by applying the respective internal mathematical function F(x) to the scalar values from the nodes 3358 of the previous neural layer.

The final neural layer includes only a single node 3358. The final neural layer receives the scalar values generated by each node 3358 of the previous neural layer 3356d. The node 3358 of the final neural layer 3356e generates a data value 3368 by applying a mathematical function F(x) to the scalar values received from the nodes 3358 of the neural layer 3356d.

In the example of FIG. 9, the data value 3368 corresponds to the predicted reflectivity of an intermediate reflective multilayer structure M' generated by reflector data corresponding to values included in the reflector conditions matrix 3352. In other embodiments, the final neural layer 3356e may generate multiple data values each corresponding to a particular reflective multilayer characteristic such as reflectivity, or other characteristics of a reflective multilayer. The final neural layer 3356e will include a respective node 3358 for each output data value to be generated. In the case of a predicted reflectivity, engineers can provide constraints that specify that the predicted reflectivity 3368 must fall within a selected range, such as greater than 70%, in one example. The analysis model 3302 will adjust internal functions F(x) to ensure that the data value 3368 corresponding to the predicted reflectivity will fall within the specified range.

During the machine learning process, the analysis model compares the predicted reflectivity in the data value 3368 to the actual reflectivity or rigorously calculated reflectivity of the intermediate reflective multilayer structure M' as indicated by the data value 3370. As set forth previously, the training set data 3306 includes, for each set of historical environmental conditions data, historic reflector data indicating the characteristics of the intermediate reflective multilayer structure M' that resulted from the historical generating process (e.g., operation 410). Accordingly, the data field 3370 includes the actual reflectivity of the intermediate reflective multilayer structure M' that resulted from the generating process reflected in the reflector conditions matrix 3352. The analysis model 3302 compares the predicted reflectivity from the data value 3368 to the actual reflectivity from the data value 3370. The analysis model 3302 generates an error value 3372 indicating the error or difference between the predicted reflectivity from the data value 3368 and the actual reflectivity from the data value 3370. The error value 3372 is utilized to train the analysis model 3302.

The training of the analysis model 3302 can be more fully understood by discussing the internal mathematical functions F(x). While all of the nodes 3358 are labeled with an internal mathematical function F(x), the mathematical function F(x) of each node is unique. In one example, each internal mathematical function has the following form:

$$F(x) = x1*w1 + x2*w2 + \ldots xn*w1 + b.$$

In the equation above, each value x1-xn corresponds to a data value received from a node 3358 in the previous neural layer, or, in the case of the first neural layer 3356a, each value x1-xn corresponds to a respective data value from the data fields 3354 of the reflector conditions matrix 3352. Accordingly, n for a given node is equal to the number of nodes in the previous neural layer. The values w1-wn are scalar weighting values associated with a corresponding node from the previous layer. The analysis model 3302 selects the values of the weighting values w1-wn. The constant b is a scalar biasing value and may also be multiplied by a weighting value. The value generated by a node 3358 is based on the weighting values w1-wn. Accordingly, each node 3358 has n weighting values w1-wn. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 3372 has been calculated, the analysis model 3302 adjusts the weighting values w1-wn for the various nodes 3358 of the various neural layers 3356a-3356e. After the analysis model 3302 adjusts the weighting values w1-wn, the analysis model 3302 again provides the reflector conditions matrix 3352 to the input neural layer 3356a. Because the weighting values are different for the various nodes 3358 of the analysis model 3302, the predicted reflectivity 3368 will be different than in the previous iteration. The analysis model 3302 again generates an error value 3372 by comparing the actual reflectivity 3370 to the predicted reflectivity 3368.

The analysis model 3302 again adjusts the weighting values w1-wn associated with the various nodes 3358. The analysis model 3302 again processes the reflector conditions matrix 3352 and generates a predicted reflectivity 3368 and associated error value 3372. The training process includes adjusting the weighting values w1-wn in iterations until the error value 3372 is minimized.

FIG. 9 illustrates a single reflector conditions matrix 3352 being passed to the analysis model 3302. In practice, the training process includes passing a large number of reflector conditions matrices 3352 through the analysis model 3302, generating a predicted reflectivity 3368 for each reflector conditions matrix 3352, and generating associated error value 3372 for each predicted reflectivity. The training process can also include generating an aggregated error value indicating the average error for all the predicted reflectivities for a batch of reflector conditions matrices 3352. The analysis model 3302 adjusts the weighting values w1-wn after processing each batch of reflector conditions matrices 3352. The training process continues until the average error across all reflector conditions matrices 3352 is less than a selected threshold tolerance. When the average error is less than the selected threshold tolerance, the analysis model 3302 training is complete and the analysis model is trained to accurately predict the reflectivity of intermediate reflective multilayer structures M' based on the environmental conditions. The analysis model 3302 can then be used to predict reflectivities and to select reflector conditions that will result in a desired reflectivity. During use of the trained model 3302, an environmental conditions vector or matrix, representing current environmental conditions for a current intermediate reflective multilayer structure M', and having similar format as the reflector conditions matrix 3352, is provided to the trained analysis model 3302. The trained analysis model 3302 can then predict the reflectivity of the intermediate reflective multilayer structure M' that will result from those environmental conditions.

A particular example of a neural network based analysis model 3302 has been described in relation to FIG. 9. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Embodiments may provide advantages. The reflective multilayers 20A-20C have enhanced reflectivity due to inclusion of various techniques, such as aperiodicity in layer ordering, free form variable layer thickness, inverse stochastic design, and/or additional layer materials. By combining these techniques, enhancement to reflectivity of a lithography exposure system including ten of the reflective multilayers 20A-20C is at least 15% for a two-material configuration to at least 50% for a configuration using four or more materials. The increase in reflectivity enables higher wafer-per-hour throughput in EUV lithography for more cost-effective high volume manufacturing of semiconductor electronics.

In accordance with at least one embodiment, a lithography exposure system comprises a light source, a substrate stage, and a mask stage between the light source and the substrate stage along an optical path from the light source to the substrate stage. The lithography exposure system further comprises a reflector along the optical path. The reflector comprises: a first layer having a first material and a first thickness; a second layer having the first material and a second thickness different from the first thickness; and a third layer between the first layer and the second layer, and having a second material different from the first material.

In accordance with at least one embodiment, a lithography exposure system comprises an optical path between a light source and a substrate stage, and a first reflector along the optical path having a first angle of incidence. The first reflector comprises at least three first material layers. The first material layers have a first number of layer materials, a second number of layer thicknesses, and a first ordering of the first material layers. The lithography exposure system further comprises a second reflector along the optical path having a second angle of incidence different from the first angle of incidence. The second reflector comprises at least three second material layers. The second material layers have a third number of the layer materials, a fourth number of the layer thicknesses, and a second ordering of the second material layers. At least one of conditions is met of: the third number is different from the first number; the fourth number is different from the second number; or the second ordering is different from the first ordering.

In accordance with at least one embodiment, a method comprises: forming a plurality of intermediate reflective multilayer structure configurations by performing an inverse design algorithm; and based on a reflective multilayer structure configuration selected from the plurality of intermediate reflective multilayer structure configurations, forming a reflective multilayer. The reflective multilayer is formed by: forming a first material layer having a first material and a first thickness; forming a second material layer on the first material layer, the second material layer having a second material and a second thickness different from the first material and the first thickness, respectively; and forming a third material layer on the second material layer, the third material layer having the first material and a third thickness different from the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography exposure system, comprising:
a light source;
a substrate stage;
a mask stage between the light source and the substrate stage along an optical path from the light source to the substrate stage; and
a reflector along the optical path, comprising:
a first layer having a first material and a first thickness;
a second layer having the first material and a second thickness different from the first thickness;
a third layer between the first layer and the second layer, and having a second material different from the first material;
a fourth layer having a third material different from the first and second materials; and
a fifth layer having a fourth material different from the first, second, and third materials;
wherein the first material includes silicon, the second material includes molybdenum, the third material includes ruthenium, and the fourth material includes strontium or beryllium.

2. The lithography exposure system of claim 1, wherein the first, second, third, and fourth materials each have extinction coefficient less than about 0.02.

3. The lithography exposure system of claim 1, wherein:
the reflector further comprises a sixth layer having the first material; and
the fourth layer is between the second layer and the sixth layer.

4. The lithography exposure system of claim 1, further comprising:
an illuminator comprising at least two first reflectors, and located along the optical path between the light source and the mask stage; and
a projection optics box comprising at least two second reflectors, and located along the optical path between the mask stage and the substrate stage;
wherein the reflector is one of the at least two first reflectors or one of the at least two second reflectors;
wherein the light source is an extreme ultraviolet (EUV) light source.

5. A lithography exposure system, comprising:
an optical path between a light source and a substrate stage;
a first reflector along the optical path having a first angle of incidence, and comprising:
at least four first material layers having at least four different respective layer materials, a second number of layer thicknesses, and a first ordering of the first material layers, wherein each of the at least four different layer materials has extinction coefficient less than about 0.02; and
a second reflector along the optical path having a second angle of incidence different from the first angle of incidence, and comprising:
at least three second material layers having fewer than four different layer materials, a fourth number of the layer thicknesses, and a second ordering of the second material layers.

6. The lithography exposure system of claim 5, wherein the first reflector comprises:
a first region extending from a first depth to a second depth of the first reflector; and
a second region extending from a third depth to a fourth depth of the first reflector, the second region not overlapping the first region along depth of the first reflector, and having different configuration of first material layers from the first region.

7. The lithography exposure system of claim 6, wherein thickness variation of the first material layers in the first region is greater than thickness variation of the first material layers in the second region.

8. The lithography exposure system of claim 6, wherein number of different layer materials in the first region is different from number of different layer materials in the second region by at least 1.

9. The lithography exposure system of claim 6, wherein the first material layers in the first region comprise:
third material layers comprising a first material; and
fourth material layers comprising a second material different from the first material;
wherein the third material layers have different thickness variation from the fourth material layers.

10. A method, comprising:
forming a plurality of intermediate reflective multilayer structure configurations by performing an inverse design algorithm; and
based on a reflective multilayer structure configuration selected from the plurality of intermediate reflective multilayer structure configurations, forming a reflective multilayer by:
forming a first material layer having a first material and a first thickness;
forming a second material layer on the first material layer, the second material layer having a second material and a second thickness different the first thickness;
forming a third material layer on the second material layer, the third material layer having the first material and a third thickness different from the first thickness;
forming a fourth material layer on the third material layer, the fourth material layer having a third material; and
forming a fifth material layer on the fourth material layer, the fifth material layer having a fourth material;
wherein the first material, the second material, the third material and the fourth material are different from each other, and each of the first material, the second material, the third material and the fourth material has extinction coefficient less than or equal to that of ruthenium.

11. The method of claim 10, wherein forming the plurality of intermediate reflective multilayer structure configurations comprises:
forming a second intermediate reflective multilayer structure configuration by altering at least one parameter of at least one layer of a first intermediate reflective multilayer structure configuration.

12. The method of claim 11, wherein altering the at least one parameter comprises altering a position of the at least one layer.

13. The method of claim 11, wherein altering the at least one parameter comprises altering a material of the at least one layer.

14. The method of claim 11, wherein altering the at least one parameter comprises altering a thickness of the at least one layer.

15. The method of claim 10, wherein forming the plurality of intermediate reflective multilayer structure configurations comprises:
recombining a first layer and a second layer of a first intermediate reflective multilayer structure configuration of the plurality of intermediate reflective multilayer structure configurations.

16. The method of claim 15, wherein:
the first layer has a first reflector material;
the second layer has a second reflector material, and is immediately adjacent the first layer; and
the recombining comprises changing the second layer from the second reflector material to the first reflector material.

17. The method of claim 16, wherein the first reflector material is different than the second reflector material.

* * * * *